United States Patent [19]

Anmo et al.

[11] Patent Number: 5,324,672
[45] Date of Patent: Jun. 28, 1994

[54] MANUFACTURING METHOD FOR BIPOLAR TRANSISTOR

[75] Inventors: Hiroaki Anmo; Hiroyuki Miwa, both of Kanagawa, Japan

[73] Assignee: Sony Corporation, Tokyo, Japan

[21] Appl. No.: 966,085

[22] Filed: Oct. 23, 1992

[30] Foreign Application Priority Data

| Oct. 24, 1991 | [JP] | Japan | 3-307087 |
| Nov. 21, 1991 | [JP] | Japan | 3-333969 |
| Dec. 6, 1991 | [JP] | Japan | 3-349536 |
| Dec. 11, 1991 | [JP] | Japan | 3-351101 |

[51] Int. Cl.⁵ .................. H01L 21/265; H01L 29/70
[52] U.S. Cl. ................ 437/31; 148/DIG. 10; 257/588
[58] Field of Search .............. 437/31; 148/DIG. 10, 148/DIG. 11; 257/554, 587, 588

[56] References Cited

U.S. PATENT DOCUMENTS

| 4,546,536 | 10/1985 | Anantha et al. | 148/DIG. 10 |
| 4,782,030 | 11/1988 | Katsumata et al. | 257/588 |
| 4,789,885 | 12/1988 | Brighton et al. | 257/588 |
| 4,960,726 | 10/1990 | Lechaton et al. | 437/31 |
| 4,975,381 | 12/1990 | Taka et al. | 148/DIG. 11 |
| 4,997,775 | 3/1991 | Cook et al. | 437/31 |
| 5,065,208 | 11/1991 | Shah et al. | 257/587 |
| 5,109,262 | 4/1992 | Kadota et al. | 257/587 |
| 5,187,554 | 2/1993 | Miwa | 257/587 |
| 5,204,277 | 4/1993 | Somero et al. | 148/DIG. 10 |
| 5,232,861 | 8/1993 | Miwa | 437/31 |
| 5,254,485 | 10/1993 | Segawa et al. | 148/DIG. 10 |

FOREIGN PATENT DOCUMENTS 0140665 6/1989 Japan .................... 437/31

*Primary Examiner*—Olik Chaudhuri
*Assistant Examiner*—Long Pham
*Attorney, Agent, or Firm*—Hill, Steadman & Simpson

[57] ABSTRACT

A bipolar transistor including a semiconductor layer formed on a semiconductor substrate; a base region formed at an upper portion of the semiconductor layer; a graft base region formed at the upper portion of the semiconductor layer so as to connect with a periphery of the base region; an emitter region formed at an upper portion of the base region; an offset insulating film formed on the base region around the emitter region; a collector buried region formed in the semiconductor layer below the base region; a collector drawn region formed in the semiconductor layer so as to connect with the collector buried region and be arranged on the side of the base region adjacent to an element isolating region; an emitter electrode formed on the offset insulating film so as to connect with the emitter region; an emitter insulating film formed so as to cover the emitter electrode; a base electrode formed so as to connect with the graft base region and contact with the emitter insulating film; and a collector electrode formed so as to connect with the collector drawn region.

2 Claims, 27 Drawing Sheets

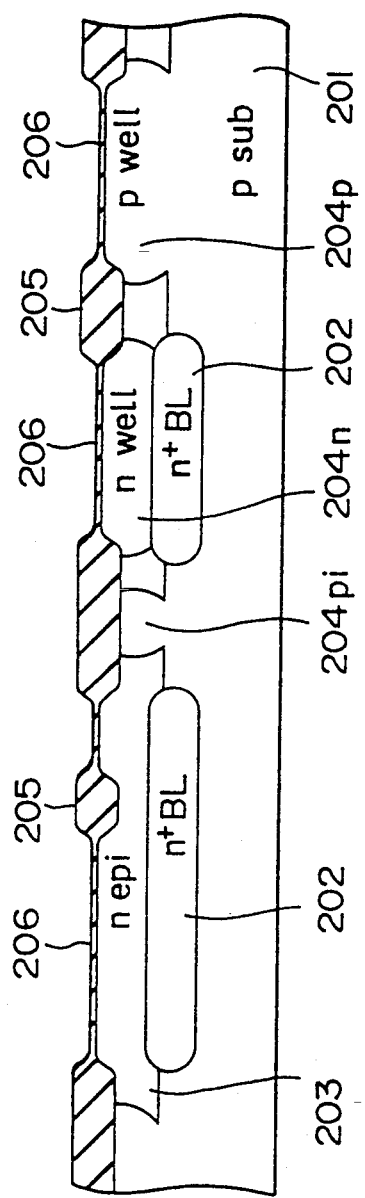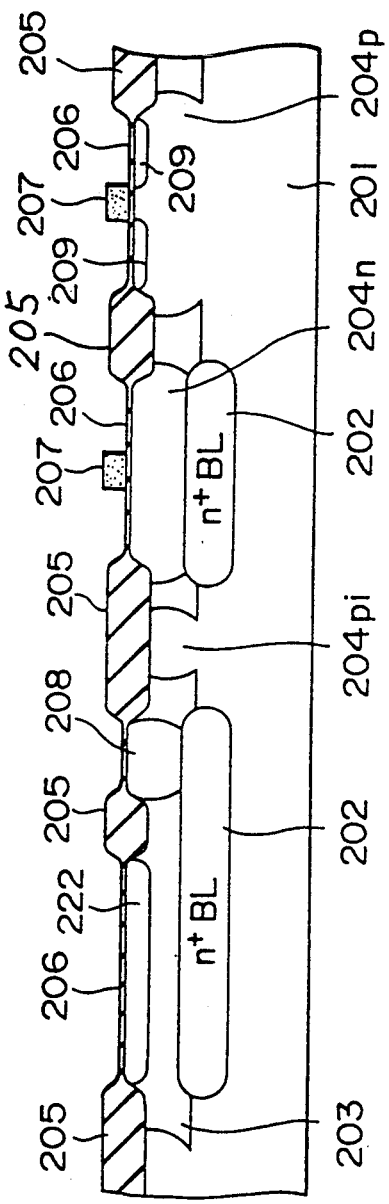

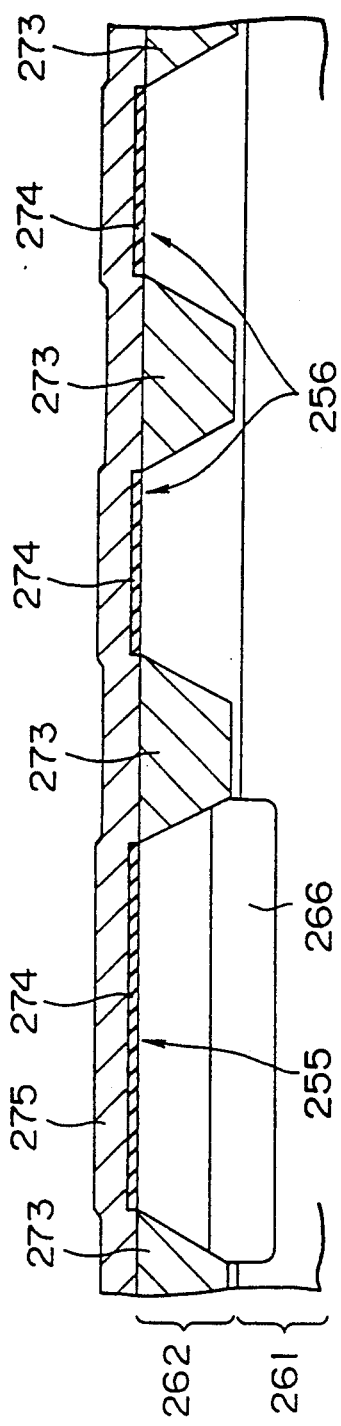
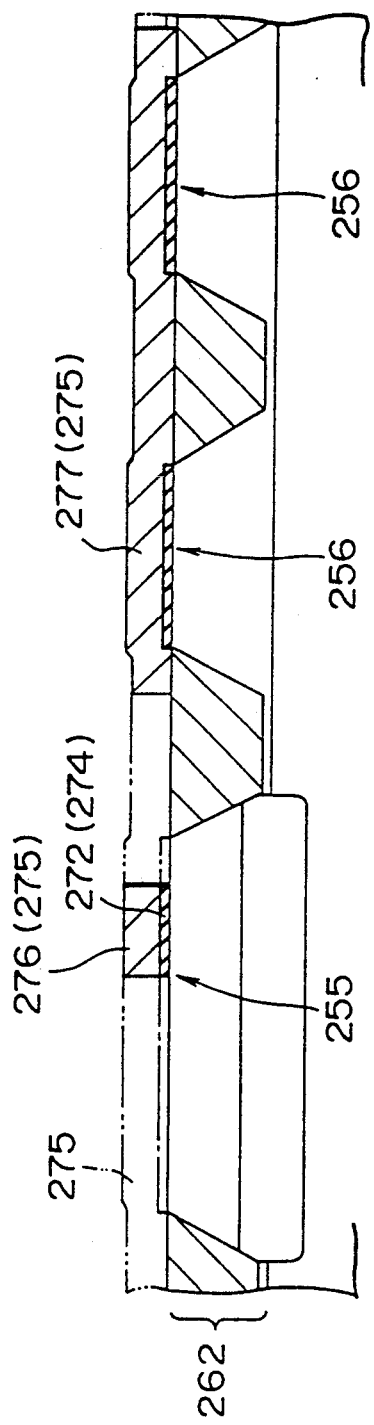
FIG. 12A
FIG. 12B

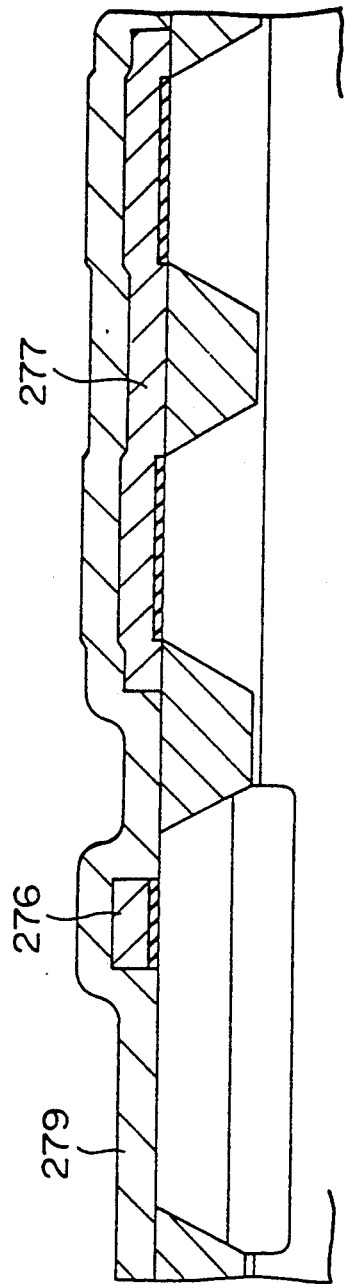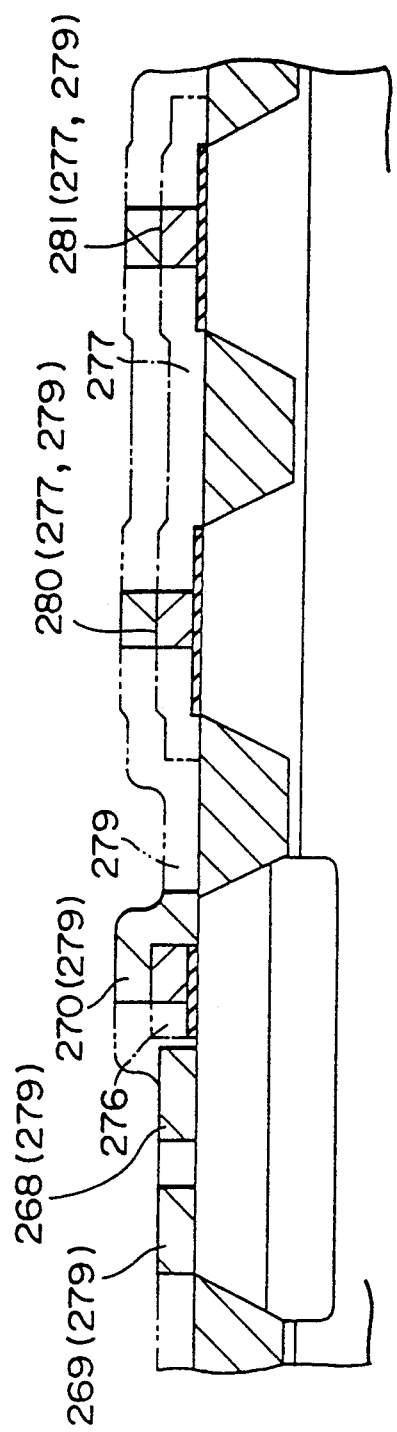

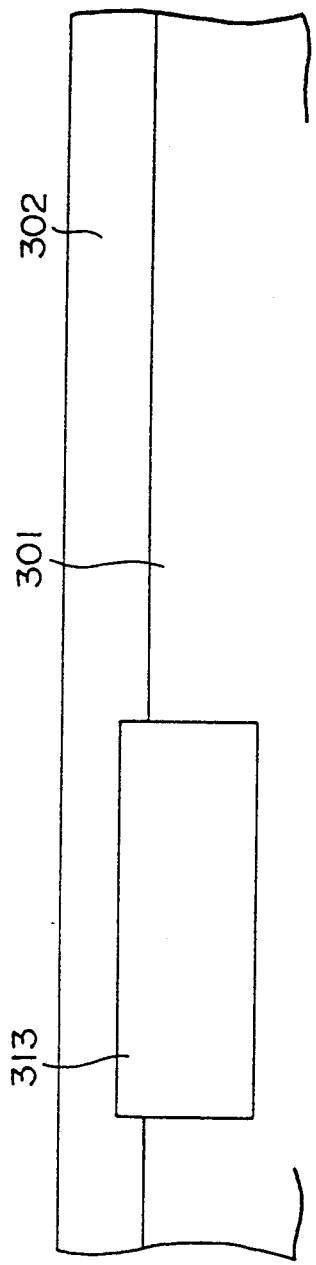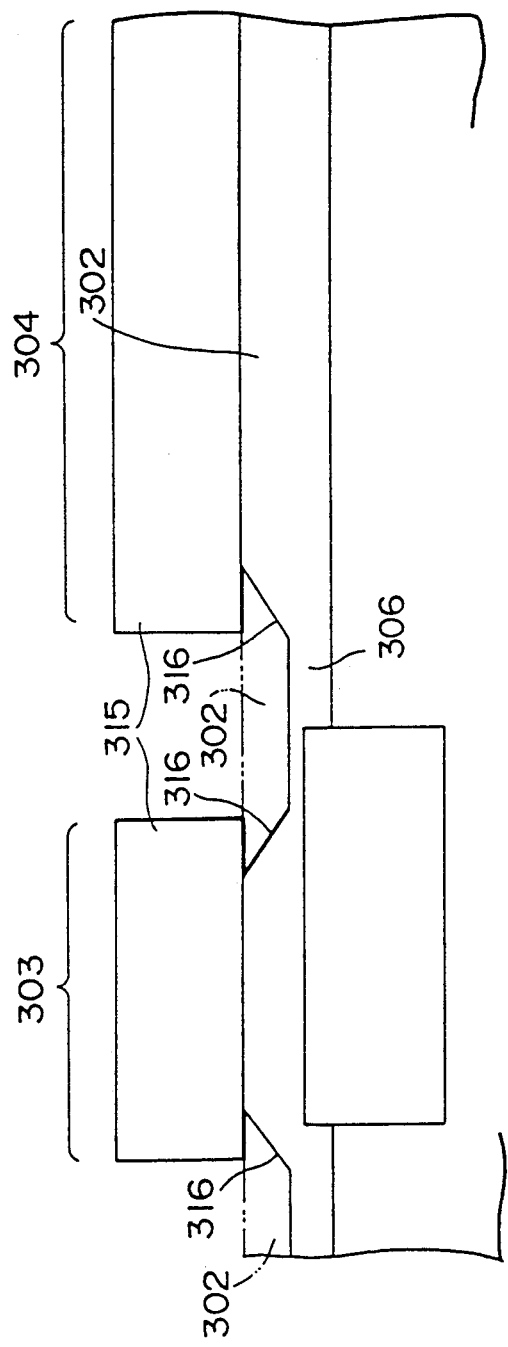
FIG. 15A
FIG. 15B

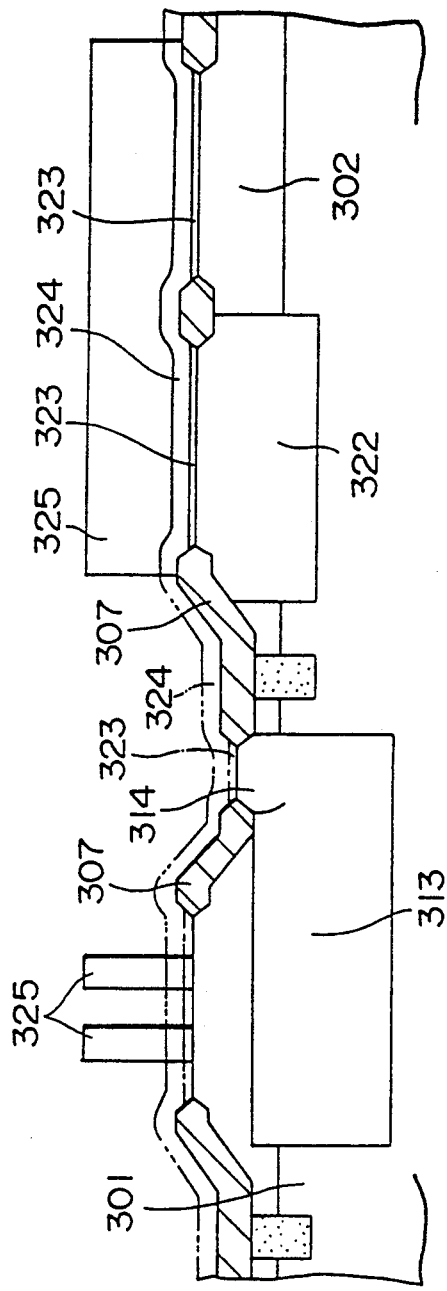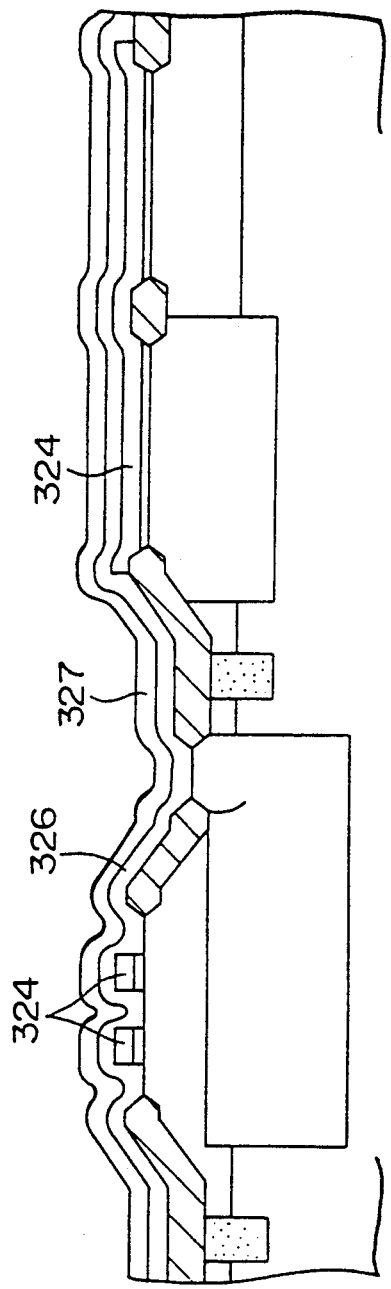

F I G. 16
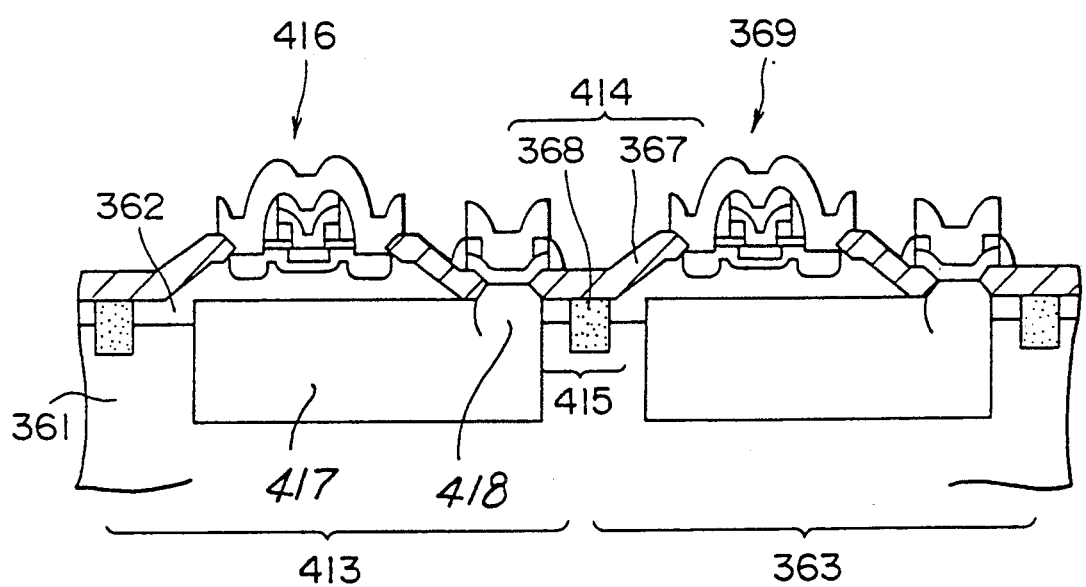

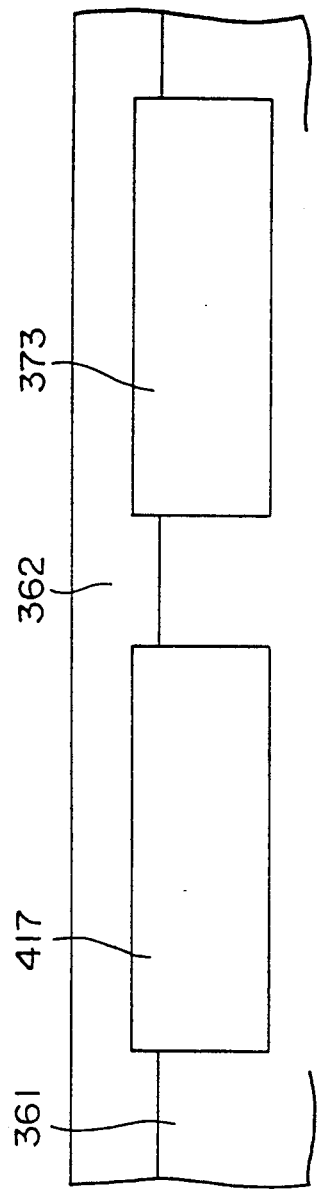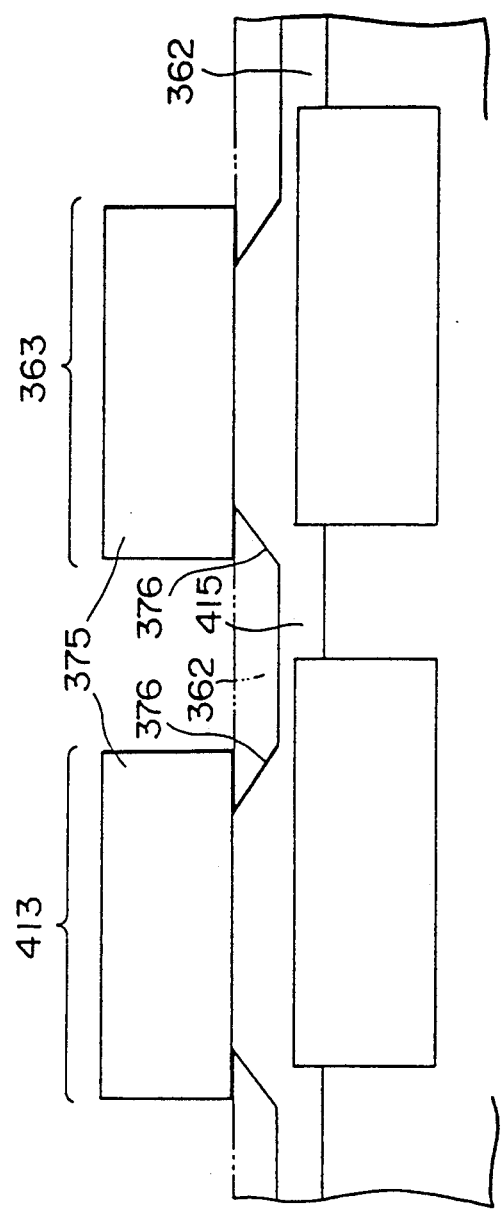

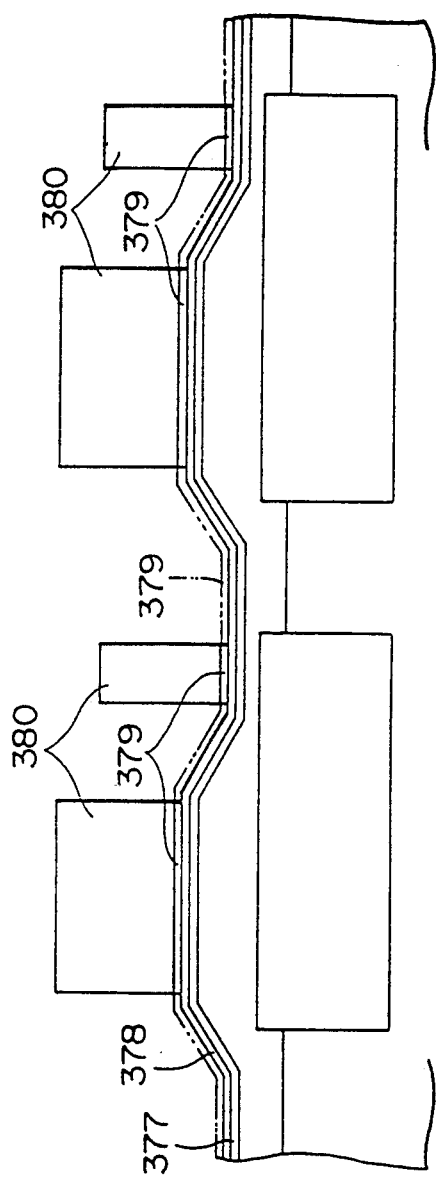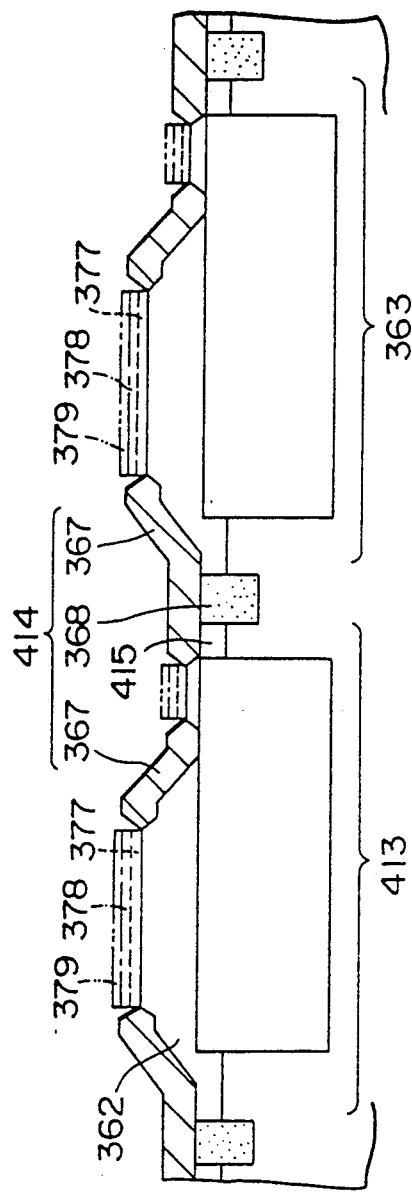

MANUFACTURING METHOD FOR BIPOLAR TRANSISTOR

BACKGROUND OF THE INVENTION

The present invention relates to a bipolar transistor and a Bi-CMOS device including the bipolar transistor, and also relates to a manufacturing method for the bipolar transistor and the Bi-CMOS device.

There have been demanded large scale and high performance of LSIs. In particular, Bi-CMOS devices are remarkable since they have the advantage of CMOS transistors such as high integration and low power consumption and the advantage of bipolar transistors such as high-speed operation.

Such Bi-CMOS devices have a composite element structure of CMOS transistors and bipolar transistors. In general, a manufacturing method for a Bi-CMOS device is complex with many steps to cause a high manufacturing cost.

FIG. 1 is a sectional view of a bipolar transistor to be formed in a manufacturing process for a CMOS transistor in a Bi-CMOS device in the prior art.

Referring to FIG. 1, reference numeral 1 designates a semiconductor substrate such as a p-type monocrystal silicon substrate, and reference numeral 2 designates a semiconductor layer formed at an upper portion of the semiconductor substrate. The semiconductor layer 2 is formed as an n+ epitaxial growth layer.

An n+ collector buried region 3 is formed in the semiconductor layer 2 and the semiconductor substrate 1.

A p-type base region 4 is formed at an upper portion of the semiconductor layer 2 above the n+ collector buried region 3. An n+ emitter region 5 is formed at an upper portion of the p-type base region 4. A p+ graft base region 6 is formed at the upper portion of the semiconductor layer 2 so as to connect with a periphery of the p-type base region 4.

An element isolating region 7 is formed in the semiconductor layer 2, and an n+ collector drawn region 8 is formed in the semiconductor layer 2 so as to connect with the n+ collector buried region 3 and be arranged on the side of the p-type base region 4 adjacent to the element isolating region 7.

A base electrode 9, emitter electrode 10 and collector electrode 11 are formed on the p+ graft base region 8, the n+ emitter region 5 and the n+ collector drawn region 8 of the semiconductor layer 2, respectively.

An offset insulating film 12 is formed on the p-type base region 4 around the n+ emitter region 5. An emitter side wall insulating film 13 is formed on a side wall of the emitter electrode 10 so as to connect with the offset insulating film 12.

A manufacturing method for the NPN bipolar transistor shown in FIG. 1 will now be described with reference to FIGS. 2A to 2C.

In the first step shown in FIG. 2A, an n+ collector buried region 3 is formed in an upper layer of a semiconductor substrate 1 such as a p-type monocrystal silicon substrate by an ion implantation process. Then, a semiconductor layer 2 such as an n-type epitaxial growth layer is formed on an upper surface of the semiconductor substrate 1 by an epitaxial growth process.

Then, a plurality of element isolating regions 7, 14 and 15 are formed at an upper portion of the semiconductor layer 2 by a LOCOS process.

Then, upper surfaces of the element isolating regions 7, 14 and 15 and the semiconductor layer 2 are flattened by an etch-back process.

Then, a first insulating film 16 is formed on the upper surface of the semiconductor layer 2 by a thermal oxidation process.

Then, a first polysilicon film 17 is formed on the entire upper surface of the semiconductor layer 2 so as to cover the first insulating film 16 and the element isolating regions 7, 14 and 15 by a CVD (Chemical Vapor Deposition) process.

Then, a portion (shown by a two-dot chain line) of the first polysilicon film 17 is removed by a photolithography and etching process to form a mask pattern 18 as the remaining portion of the first polysilicon film 17.

Then, a portion (shown by a one-dot chain line) of the first insulating film 16 is removed by an RIE (Reactive Ion Etching) process using the mask pattern 18 as an etching mask, thereby forming an offset insulating film 12 as the remaining portion of the first insulating film 16 on a base forming region 20 around an emitter forming region 19.

In the second step shown in FIG. 2B, a second polysilicon film 21 is formed on the entire upper surface of the semiconductor layer 2 so as to cover the mask pattern 18 by a CVD process. Then, a portion (shown by a one-dot chain line) of the second polysilicon film 21 and a portion (shown by a dashed line) of the mask pattern 18 are removed by a photolithography and RIE process to form a base electrode 9, an emitter electrode 10 and a collector electrode 11 as the remaining portion of the second polysilicon film 21.

Then, an n+ collector drawn region 8 is formed at the upper portion of the semiconductor layer 2 between the element isolating regions 7 and 15 so as to connect with the n+ collector buried region 3 by an ion implantation process.

In the third step shown in FIG. 2C, a second insulating film 22 such as a silicon oxide film is formed on the entire upper surface of the semiconductor layer 2 so as to cover the electrodes 8, 10 and 11 by a CVD process.

Then, a portion (shown by a two-dot chain line) of the second insulating film 22 is removed by an etch-back process to form an emitter side wall insulating film 13 on a side wall of the emitter electrode 10.

Then, boron ions are implanted into the upper portion of the semiconductor layer 2 by an ion implantation process to form a p+ graft base region 6 on the opposite sides of the base forming region 20.

Then, boron ions are implanted into the emitter electrode 10 by an ion implantation process, and then the boron ions in the emitter electrode 10 are diffused into the base forming region 20 by an impurity diffusion process to form a p-type base region 4 connected with the p+ graft base region 6.

Then, arsenic ions are implanted into the emitter electrode 10 by an ion implantation process, and then the arsenic ions in the emitter electrode 10 are diffused into an upper portion of the p-type base region 4 by an impurity diffusion process to form an n+ emitter region 5.

In this manner, the NPN bipolar transistor shown in FIG. 1 is manufactured.

In the prior art bipolar transistor mentioned above, however, a distance between the base electrode 9 and the emitter electrode 10 is decided by a resolution in the photolithography process. Accordingly, in order to obtain a sufficient resolution in the photolithography process, a sufficient distance W between the emitter electrode 10 and a base contact portion 24 must be defined. Even in the case of a photolithography process using an excimer laser, the distance W becomes about 0.25–0.3 μm.

Accordingly, the bipolar transistor cannot be sufficiently reduced in size. As a result, a collector—base parasitic capacitance and a collector saturation parasitic capacitance cannot be reduced to cause a reduction of a cut-off frequency and an elongation of a delay time. Accordingly, electrical characteristics of the bipolar transistor is reduced.

FIG. 3 shows an example of a Bi-CMOS device in the prior art.

Referring to FIG. 3, the Bi-CMOS device includes a p-type semiconductor substrate 31, n+ buried layer 32, n-type epitaxial growth layer 33, p-type well 34p of an n-type MOS transistor, n-type well 34n of a p-type MOS transistor, p-type isolation layer 34pi, selective oxide film 35, gate insulating film 36, gate electrodes 37 formed of polysilicon, n+ collector drawn region 38, LDD 39 of the n-type MOS transistor, gate side wall insulating film 40 formed on a side wall of each gate electrode 37, source and drain 41 of the n-type MOS transistor, emitter window opening insulating film 42, p+ base drawn region 43 selectively formed in a base region 27 formed in the n-type epitaxial growth layer 33, source and drain 44 of the p-type MOS transistor, emitter window 45 formed through the emitter window opening insulating film 42, emitter polysilicon layer 46, n+ collector electrode drawn portion 37, emitter region 48 formed by diffusing an impurity in the emitter polysilicon layer 46 to a surface portion of the base region 27, interlayer insulating film 49, contact holes 50 and 50e formed through the interlayer insulating film 49, and aluminum electrodes 26.

The Bi-CMOS device mentioned above is manufactured by forming the n+ buried region 32 at a surface portion of the p-type semiconductor substrate 31, forming the n-type epitaxial growth layer 33, forming the n-type well 34n, the p-type well 34p and the p-type isolation layer 34pi, forming the gate insulating film 36, the gate electrodes 37, the n+ collector drawn region 38, the base region 27, the LDD 39, the source and drain 44 of the n-type MOS transistor and the source and drain 41 of the p-type MOS transistor, forming the p+ base drawn region 43, entirely forming the emitter window opening insulating film 42, etching the insulating film 42 to form the emitter window 45, forming the emitter polysilicon layer 46 and patterning the same, forming the emitter region 48 by diffusion, forming the interlayer insulating film 49, forming the contact holes 50 and 50e, and forming the electrodes 26 after flattening the upper surface by reflowing.

However, the prior art Bi-CMOS device shown in FIG. 3 has the following problems.

First, an etching depth at a portion of the interlayer insulating film 49 where the emitter contact hole 50e is to be formed is different by a thickness of the emitter window opening insulating film 42 from an etching depth at another portion of the interlayer insulating film 49 where the other contact holes 50 are to be formed. Accordingly, the emitter polysilicon layer 46 is overetched to be thinned by anisotropic etching for the formation of the contact holes 50e and 50. As a result, there is a possibility that the aluminum electrode 26 to be later formed in the emitter contact hole 50e will penetrate through the emitter polysilicon layer 46, or a variation in characteristics will occur. However, if the emitter polysilicon layer 46 is not overetched, the contact holes 50 other than the emitter contact hole 50e will not be perfectly formed, so that the upper surface of the semiconductor substrate 31 cannot be exposed.

Secondly, there is a possibility that the upper surface of the base region 27 is damaged by anisotropic etching for the formation of the gate side wall insulating film 40 which is essential to obtain a MOS transistor having an LDD structure, causing an increase in leakage current in the bipolar transistor.

That is, in the stage where the gate side wall insulating film 40 is to be formed, the base region 27 of the bipolar transistor is covered with only the gate insulating film 36 formed before the formation of the gate electrodes 37. Accordingly, it cannot be avoided that the upper surface of the base region 27 is damaged by the overetching by RIE. Such damage of the upper surface of the base region 27 causes an increase in leakage current in the bipolar transistor.

Thirdly, as previously mentioned, the thicker the emitter window opening insulating film 42, the more the emitter polysilicon layer 46 must be overetched. Therefore, it is obliged to reduce the thickness of the insulating film 42. However, the reduction in the thickness of the insulating film 42 causes an increase in emitter—base parasitic capacitance to reduce a high-speed operability. That is, the emitter polysilicon layer 46 is so patterned as to fully cover the emitter window 45 and extend laterally. Such an extended portion of the emitter polysilicon layer 46 is opposed to the upper surface of the base region 27 with the emitter window opening insulating film 42 interposed therebetween. As a result, an electrostatic capacitance is generated between the extended portion and the base region 27, causing the increase in the emitter—base parasitic capacitance.

Accordingly, it is necessary to reduce the parasitic capacitance. This is effectively attained by thickening the emitter window opening insulating film 42, but the thickening of the insulating film 42 is not permitted for the above reason.

Finally, the formation of the base drawn region 43 by the ion implantation must precede the formation of the emitter region 48 by the thermal diffusion. Accordingly, it is difficult to shallow the base drawn region.

That is, if the base drawn region 43 is formed after the formation of the emitter region 48, the ion implantation for the formation of the base drawn region 43 must be performed through the emitter window opening insulating film 42, with the result that a high dose of ions to be implanted cannot be obtained. For this reason, the ion implantation for the formation of the base drawn region 43 must precede the formation of the emitter region 48.

However, since the base drawn region 43 is formed before the formation of the emitter region 48, the base drawn region 43 previously formed is diffused to be expanded by the heating in forming the emitter region 48. This causes an increase in collector—base parasitic capacitance and hinders high integration of elements.

FIG. 4 shows an example of a very high speed Bi-CMOS device in the prior art.

Referring to FIG. 4, a semiconductor layer 52 such as an n-type epitaxial growth layer is formed at an upper portion of a semiconductor substrate 51. The semiconductor layer 52 includes a plurality of element isolating regions 53, a bipolar transistor forming region 54, an n-type MOS transistor forming region 55 of a CMOS transistor, and a p-type MOS transistor forming region 56 of the CMOS transistor. The bipolar transistor forming region 54, the n-type MOS transistor forming region 55 and the p-type MOS transistor forming region 56 are isolated from each other by the element isolating regions 53.

An NPN bipolar transistor 61 is formed in the bipolar transistor forming region 54. The NPN bipolar transistor 61 has the following structure. That is, an n+ collector buried region 62 is formed at an upper portion of the semiconductor substrate 51 and a lower portion of the semiconductor layer 52. A p-type base region 63 is formed at the upper portion of the semiconductor layer 52 above the n+collector buried region 62. An n+ emitter region 64 is formed at an upper portion of the p-type base region 63. A p+ graft base region 65 is formed at the upper portion of the semiconductor layer 52 on one side of the p-type base region 63. An n+ collector drawn region 66 connected with the n+ collector buried region 62 is formed in the semiconductor layer 52 on the other side of the p-type base region 63 so as not to be connected with the p-type base region 63.

A base electrode 67, an emitter electrode 68 and a collector electrode 69 all formed from the same polysilicon film is formed on the semiconductor layer 52 so as to be connected with the p+ graft base region 65, the n+ emitter region 64 and the n+ collector drawn region 66, respectively.

Further, a first interelectrode insulating film 70A is formed between the base electrode 67 and the emitter electrode 68, and a second interelectrode insulating film 70B is formed between the emitter electrode 68 and the collector electrode 69.

On the other hand, an n-type MOS transistor 71 is formed in the n-type MOS transistor forming region 55, and a p-type MOS transistor 81 is formed in the p-type MOS transistor forming region 56. Gates 71 and 82 are formed on the n-type MOS transistor 71 and the p-type MOS transistor 81 through gate insulating films 92, respectively. The gates 71 and 82 are formed from the polysilicon film forming the electrodes 67, 68 and 69 of the NPN bipolar transistor 61. A source and drain region 73 having an LDD structure is formed at the upper portion of the semiconductor layer 52 on the opposite sides of the gate 72. Similarly, a source and drain region 83 having an LDD structure is formed at the upper portion of the semiconductor layer 52 on the opposite sides of the gate 82.

The very high speed Bi-CMOS device shown in FIG. 4 is manufactured in the following manner.

In the first step, an n+ collector buried region 62 is formed at an upper portion of a semiconductor substrate 51 such as a p-type monocrystal silicon substrate by an ordinary method. Then, a semiconductor layer 52 such as an n-type epitaxial growth layer is formed on an upper surface of the semiconductor substrate 51 by an epitaxial growth process.

Then, a plurality of element isolating regions 53 are formed at an upper portion of the semiconductor layer 52 by a LOCOS process. Then, upper surfaces of the element isolating regions 53 are flattened by an etchback process.

Then, a first insulating film is formed on an upper surface of the semiconductor layer 52 by a thermal oxidation process.

Then, a portion of the first insulating film in a bipolar transistor forming region 54 is removed by a photolithography and etching process to form gate insulating films 92 in an n-type MOS transistor forming region 55 and a p-type MOS transistor forming region 56.

In the second step, a polysilicon film is formed on the entire upper surface of the semiconductor layer 52 so as to cover the gate insulating films 92 by a CVD process.

In the third step, a predetermined portion of the polysilicon film is removed by a photolithography and etching process to form a base electrode 67, an emitter electrode 68 and a collector electrode 69 of the bipolar transistor and gates 72 and 82 of the CMOS transistor from the polysilicon film.

In the fourth step, a second insulating film such as a silicon oxide film is formed on the entire upper surface of the semiconductor layer 52 so as to cover the electrodes 67, 68 and 89 and the gates 72 and 82 by a CVD process. Then, a predetermined portion of the second polysilicon film is removed by an etch-back process to form gate side wall insulating films 74 and 84 on side walls of the gates 72 and 82, respectively, and also form a first interelectrode insulating film 70A between the base electrode 67 and the emitter electrode 68 and a second interelectrode insulating film 70B between the emitter electrode 68 and the collector electrode 69, from the second insulating film. Thus, the interelectrode insulating films 70A and 70B of the bipolar transistor and the gate side wall insulating films 74 and 84 of the CMOS transistor are commonly formed from the second insulating film.

There have not been described the step of forming a p-type base region 63, n+ emitter region 64, p+ graft base region 65 and n+ collector drawn region 66 of the NPN bipolar transistor 61, the step of forming a p-type well region 96 of the n-type MOS transistor 71, and the step of forming source and drain regions 73 and 83 of the n-type and p-type MOS transistors 71 and 81.

However, in the bipolar transistor of the Bi-CMOS device shown in FIG. 4, the emitter electrode and the gates are formed from the same polysilicon film. Accordingly, a thickness of the emitter electrode is substantially the same as that of each gate. As a result, accumulation of holes in the emitter is increased to cause an elongation of a travel time in the emitter and therefore elongate a delay time.

Further, in the above manufacturing method, the first insulating film in the CMOS transistor forming region must be covered with a resist in removing a portion of the first insulating film in the bipolar transistor forming region. Accordingly, an impurity in the resist is diffused into the first insulating film contacting the resist, causing a deterioration in quality of the gate insulating film.

Further, the interelectrode insulating film between the emitter electrode and the collector electrode of the bipolar transistor and the gate side wall insulating film of the CMOS transistor are commonly formed from the second insulating film. Accordingly, a thickness of the interelectrode insulating film is decided by a thickness of the gate side wall insulating film, so that a distance between the emitter electrode and the collector electrode cannot be enlarged. As a result, it is difficult to ensure sufficient voltage resistance between the collector and the base of the bipolar transistor. Further, voltage resistance between the emitter and the collector is also reduced.

Additionally, in the case of forming the element isolating region by deeply forming an element isolating diffusion layer, the diffusion layer is diffused laterally to result in an increase in forming area of the element isolating region. Accordingly, high integration is hindered to lower a degree of integration, and a collector—substrate parasitic capacitance is increased to lower an element performance.

Further, an element isolating method using a trench element isolating region requires a step of forming a trench, a step of burying an insulator in the trench, and a subsequent flattening step. Thus, the number of steps is largely increased to result in an increase in manufacturing cost.

SUMMARY OF THE INVENTION

It is a first object of the present invention to provide a bipolar transistor and a manufacturing method therefor which can reduce a distance between an emitter electrode and a base contact portion to thereby enable high integration of elements.

It is a second object of the present invention to provide a bipolar transistor and a manufacturing method therefor which can reduce a parasitic capacitance between a collector and a base and between a collector and a substrate to enlarge a cut-off frequency and shorten a delay time, thereby improving electrical characteristics of the bipolar transistor.

It is a third object of the present invention to provide a Bi-MOS device and a manufacturing method therefor which can prevent damage of a base surface due to anisotropic etching for the formation of a gate side wall insulating film on a gate electrode of a MOS transistor, causing a reduction in characteristics of a bipolar transistor.

It is a fourth object of the present invention to provide a Bi-MOS device and a manufacturing method therefor which can prevent overetching of an emitter polysilicon layer in forming an emitter contact hole.

It is a fifth object of the present invention to provide a Bi-MOS device and a manufacturing method therefor which can thicken an emitter window opening insulating film to thereby reduce a parasitic capacitance between an emitter and a base.

It is a sixth object of the present invention to provide a Bi-MOS device and a manufacturing method therefor which can shallow a base drawn region in a bipolar transistor and also shallow a MOS transistor having a source and a drain of the same conducting type as that of a base.

It is a seventh object of the present invention to provide a Bi-CMOS device and a manufacturing method therefor which can enlarge a distance between an emitter electrode and a collector electrode to thereby ensure sufficient voltage resistance between a collector and a base of a bipolar transistor.

It is an eighth object of the present invention to provide a Bi-CMOS device and a manufacturing method therefor which can prevent contact of a resist with a gate insulating film in patterning to avoid contamination of the gate insulating film by an impurity in the resist.

It is a ninth object of the present invention to provide a Bi-CMOS device and a manufacturing method therefor which can make a thickness of an emitter electrode thinner than that of a gate to thereby reduce accumulation of holes in an emitter and shorten a delay time.

It is a tenth object of the present invention to provide a Bi-CMOS device and a manufacturing method therefor which can reduce a forming area of an element isolating region to thereby enable high integration of elements.

It is an eleventh object of the present invention to provide a Bi-CMOS device and a manufacturing method therefor which can simplify a forming process of an element isolating region to thereby reduce a manufacturing cost.

According to a first aspect of the present invention, there is provided a bipolar transistor comprising a semiconductor layer formed on a semiconductor substrate; a base region formed at an upper portion of said semiconductor layer; a graft base region formed at the upper portion of said semiconductor layer so as to connect with a periphery of said base region; an emitter region formed at an upper portion of said base region; an offset insulating film formed on said base region around said emitter region; a collector buried region formed in said semiconductor layer below said base region; a collector drawn region formed in said semiconductor layer so as to connect with said collector buried region and be arranged on the side of said base region adjacent to an element isolating region; an emitter electrode formed on said offset insulating film so as to connect with said emitter region; an emitter insulating film formed so as to cover said emitter electrode; a base electrode formed so as to connect with said graft base region and contact with said emitter insulating film; and a collector electrode formed so as to connect with said collector drawn region.

The bipolar transistor according to the first aspect is manufactured by a method comprising the first step of forming a collector buried region at an upper portion of a semiconductor substrate, forming a semiconductor layer on an upper surface of said semiconductor substrate, forming an element isolating region in said semiconductor layer, forming a first insulating film at an upper portion of said semiconductor layer, and forming a first polysilicon film on an entire upper surface of said semiconductor layer so as to cover said first insulating film; the second step of forming a mask pattern from said first polysilicon film on a base forming region around an emitter forming region, and etching said first polysilicon film with said mask pattern used as an etching mask to form an offset insulating film from said first insulating film; the third step of forming a second polysilicon film on the entire upper surface of said semiconductor layer so as to cover said mask pattern, forming a second insulating film on an entire upper surface of said second polysilicon film, and etching said second insulating film and said second polysilicon film to form an emitter electrode from said second polysilicon film; the fourth step of forming an emitter side wall insulating film on a side wall of said emitter electrode to form an emitter insulating film constituted of said emitter side wall insulating film and said second insulating film formed on an upper surface of said emitter electrode; the fifth step of forming a graft base region at an upper portion of said semiconductor layer on both sides of said base forming region, and forming a collector drawn region in said semiconductor layer so that said collector drawn region connects with said collector buried region and is arranged on the side of said base forming region adjacent to said element isolating region; and the sixth step of forming a base region in said base forming region, forming an emitter region in said emitter forming region, and forming a base electrode connecting with said graft base region and contacting with said emitter insulating film and a collector electrode connecting with said collector drawn region.

According to a second aspect of the present invention, there is provided a bipolar transistor comprising a semiconductor layer formed on a semiconductor substrate; a base region formed at an upper portion of said semiconductor layer; a graft base region formed at the upper portion of said semiconductor layer so as to connect with one side of said base region; an emitter region formed at an upper portion of said base region; an offset insulating film formed on said base region around said emitter region and on a portion of said semiconductor layer connecting with said base region; a collector buried region formed in said semiconductor layer below said base region; a collector drawn region formed in said semiconductor layer so as to connect with said collector buried region and be arranged on the other side of said base region adjacent to said portion of said semiconductor layer connecting with said base region; an emitter electrode formed on said offset insulating film so as to connect with said emitter region; an emitter insulating film formed so as to cover said emitter electrode; a base electrode formed so as to connect with said graft base region and contact with one side of said emitter insulating film; and a collector electrode formed so as to connect with said collector drawn region and contact with the other side of said emitter insulating film.

The bipolar transistor according to the second aspect is manufactured by a method comprising the first step of forming a collector buried region at an upper portion of a semiconductor substrate, forming a semiconductor layer on an upper surface of said semiconductor substrate, forming a first insulating film at an upper portion of said semiconductor layer, and forming a first polysilicon film on an entire upper surface of said semiconductor layer so as to cover said first insulating film; the second step of forming a mask pattern from said first polysilicon film on a base forming region around an emitter forming region, and etching said first polysilicon film with said mask pattern used as an etching mask to form an offset insulating film from said first insulating film; the third step of forming a second polysilicon film on the entire upper surface of said semiconductor layer so as to cover said mask pattern, forming a second insulating film on an entire upper surface of said second polysilicon film, and etching said second insulating film and said second polysilicon film to form an emitter electrode from said second polysilicon film; the fourth step of forming an emitter side wall insulating film on a side wall of said emitter electrode to form an emitter insulating film constituted of said emitter side wall insulating film and said second insulating film formed on an upper surface of said emitter electrode; the fifth step of forming a graft base region at an upper portion of said semiconductor layer on one side of said base forming region, and forming a collector drawn region in said semiconductor layer so that said collector drawn region connects with said collector buried region and is arranged on the other side of said base forming region adjacent to a portion of said semiconductor layer connecting with said base forming region; and the sixth step of forming a base region in said base forming region, forming an emitter region in said emitter forming region, and forming a base electrode connecting with said graft base region and contacting with one side of said emitter insulating film and a collector electrode connecting with said collector drawn region and contacting with the other side of said emitter insulating film.

In the bipolar transistor according to the first and second aspects, the emitter side wall insulating film is formed on the side wall of the emitter electrode, and the second insulating film is formed on the upper surface of the emitter electrode. Accordingly, a distance between the emitter electrode and the base contact portion can be reduced with the emitter electrode insulated from the base electrode. As a result, the bipolar transistor can be reduced in size to enable high integration of elements.

Further, a parasitic capacitance between the collector and the base and between the collector and the substrate can be reduced to thereby enlarge a cut-off frequency and shorten a delay time. As a result, electrical characteristics of the bipolar transistor can be improved.

In the manufacturing method for the bipolar transistor according to the first and second aspects, the distance between the emitter electrode and the base contact portion can be decided in a self-alignment manner by utilizing the emitter side wall insulating film. Accordingly, the distance between the emitter electrode and the base contact portion can be reduced to about 0.1 $\mu$m.

According to a third aspect of the present invention, there is provided in a Bi-MOS device having a bipolar transistor and a MOS transistor; the improvement wherein an emitter window opening insulating film is formed on a portion of a base region except a base drawn region of said bipolar transistor.

The Bi-MOS device according to the third aspect is manufactured by a method comprising the first step of forming a gate electrode and an LDD region of a MOS transistor, and then entirely forming an insulating film; the second step of masking a portion of said insulating film on a portion of a base region except a base drawn region of a bipolar transistor; and the third step of simultaneously forming a gate side wall insulating film on a side wall of said gate electrode of said MOS transistor and an emitter window opening insulating film on said portion of said base region except said base drawn region of said bipolar transistor by anisotropic etching to said insulating film formed in said first step.

It is preferable that the above manufacturing method further comprises the fourth step of forming an emitter region; and the fifth step of simultaneously forming said base drawn region of said bipolar transistor and a source and a drain of said MOS transistor after said fourth step.

In the Bi-MOS device and the manufacturing method according to the third aspect, it is possible to prevent that the base surface will be damaged by the anisotropic etching for the formation of the gate side wall insulating film on the gate electrode of the MOS transistor to cause a reduction in characteristics of the bipolar transistor. Further, the emitter polysilicon layer is prevented from being overetched in forming an emitter contact hole. Further, a thickness of the emitter window opening insulating film can be made large to thereby reduce a parasitic capacitance between the emitter and the base. Further, the base drawn region can be shallowed, and the MOS transistor having a source and a drain of the same conducting type as that of the base can be also shallowed.

According to a fourth aspect of the present invention, there is provided a bipolar transistor comprising a semiconductor layer formed on a semiconductor substrate; a base region formed at an upper portion of said semiconductor layer; a graft base region formed at the upper portion of said semiconductor layer so as to connect with one side of said base region: an emitter region formed at an upper portion of said base region: a collector buried region formed in said semiconductor layer below said base region; a collector drawn region formed in said semiconductor layer on the other side of said base region so as to connect with said collector buried region; an emitter electrode formed on an upper surface of said semiconductor layer so as to connect with said emitter region; a base electrode formed on the upper surface of said semiconductor layer so as to connect with said graft base region: and a collector electrode formed on the upper surface of said semiconductor layer so as to connect with said collector drawn region; a first interelectrode insulating film formed between said base electrode and said emitter electrode; a second interelectrode insulating film formed between said emitter electrode and said collector electrode; and an offset insulating film formed below a partial lower surface of said collector electrode on said emitter electrode side so as to contact with said second interelectrode insulating film.

A Bi-CMOS device having the bipolar transistor according to the fourth aspect is manufactured by a method comprising the first step of forming a semiconductor layer on a semiconductor substrate, forming a collector buried region in said semiconductor substrate and said semiconductor layer, forming an element isolating region at an upper portion of said semiconductor layer, forming a first insulating film on an upper surface of said semiconductor layer in a bipolar transistor forming region and a CMOS transistor forming region, and forming a first polysilicon film on an entire upper surface of said semiconductor layer so as to cover said first insulating film: the second step of forming a first pattern at a portion of said bipolar transistor forming region from said first polysilicon film and a second pattern covering said CMOS transistor forming region from said first polysilicon film, and etching said first insulating film with said first and second patterns used as an etching mask to form an offset insulating film at said portion of said bipolar of said bipolar transistor forming region; the third step of forming a second polysilicon film on the entire upper surface of said semiconductor layer so as to cover said first and second patterns; the fourth step of forming a base electrode, an emitter electrode and a collector electrode in said bipolar transistor forming region from said second polysilicon film and gates in said CMOS transistor forming region from said second polysilicon film and said second pattern; and the fifth step of forming a second insulating film on the entire upper surface of said semiconductor layer so as to cover said base electrode, said emitter electrode, said collector electrode and said gates, and forming a first interelectrode insulating film between said base electrode and said emitter electrode from said second insulating film, a second interelectrode insulating film between said emitter electrode and said collector electrode from said second insulating film, and gate side wall insulating films on side walls of said gates from said second insulating film.

In the bipolar transistor according to the fourth aspect, the offset insulating film is formed below the partial lower surface of the collector electrode on the emitter electrode side. Accordingly, a distance between the emitter electrode and the collector electrode can be enlarged. As a result, sufficient voltage resistance between the collector and the base of the bipolar transistor can be ensured.

In the manufacturing method for the Bi-CMOS device having the bipolar transistor according to the fourth aspect, the first insulating film formed on the CMOS transistor forming region is covered with the first polysilicon film. Accordingly, it is possible to prevent that a resist will contact the first insulating film in patterning. As a result, the gate insulating film is prevented from being contaminated by an impurity in the resist.

Further, as the emitter electrode is formed from the second polysilicon film, and each gate of the CMOS transistor is formed from the second polysilicon film and the second pattern, a thickness of the emitter electrode becomes thinner than that of each gate. Accordingly, accumulation of holes in the emitter can be reduced to thereby shorten a delay time.

Thus, electrical characteristics of the Bi-CMOS device can be improved.

According to a fifth aspect of the present invention, there is provided in a Bi-CMOS device having a bipolar transistor and a CMOS transistor formed in a semiconductor layer; the improvement wherein said semiconductor layer comprises a first portion in which a bipolar transistor forming region for said bipolar transistor and a CMOS transistor forming region for said CMOS transistor are formed, and a second portion in which an element isolating region for isolating said bipolar transistor forming region from said CMOS transistor forming region is formed, said second portion being thinner than said first portion.

The element isolating region in the Bi-CMOS device according to the fifth aspect is manufactured by a method comprising the first step of forming a collector buried region at an upper portion of a semiconductor substrate, and then forming a semiconductor layer on an upper surface of said semiconductor substrate; the second step of partially removing an upper portion of said semiconductor layer to form a thin layer portion of said semiconductor layer; and the third step of forming in said thin layer portion said element isolating region for isolating a bipolar transistor forming region in said Bi-CMOS device from a CMOS transistor forming region in said Bi-CMOS device.

According to a sixth aspect of the present invention, there is provided in a Bi-CMOS device having a bipolar transistor and a CMOS transistor formed in a semiconductor layer; the improvement wherein said semiconductor layer comprises a first portion in which a bipolar transistor forming region for said bipolar transistor and a second transistor forming region for a transistor of another device near said bipolar transistor forming region are formed, and a second portion in which an element isolating region for isolating said bipolar transistor forming region from said second transistor forming region is formed, said second portion being thinner than said first portion.

The element isolating region in the Bi-CMOS device according to the sixth aspect is manufactured by a method comprising the first step of forming a collector buried region at an upper portion of a semiconductor substrate, and then forming a semiconductor layer on an upper surface of said semiconductor substrate; the second step of partially removing an upper portion of said semiconductor layer to form a thin layer portion of said semiconductor layer; and the third step of forming in said thin layer portion said element isolating region for isolating a bipolar transistor forming region in said Bi-CMOS device from a second transistor forming region in another device near said bipolar transistor forming region.

In the Bi-CMOS device according to the fifth and sixth aspects, the second portion of the semiconductor layer in which the element isolating region is formed is thinner than the first portion of the semiconductor layer in which the bipolar transistor forming region and the CMOS transistor forming region are formed. That is, the element isolating region is shallowed. Accordingly, in the case of forming an element isolating diffusion layer in the element isolating region, the element isolating diffusion layer can be shallowed to thereby reduce lateral diffusion of the diffusion layer. Accordingly, a forming area of the element isolating region can be reduced, and a forming area of each element can also be reduced to thereby reduce a parasitic capacitance between the collector and the substrate. As a result, high integration and high performance of the elements can be achieved.

In the manufacturing method for the element isolating region in the Bi-CMOS device according to the fifth and sixth aspects, the element isolating region can be simply formed. Accordingly, the Bi-CMOS device can be manufactured at low costs.

It is preferable that said semiconductor layer is formed as an epitaxial growth layer. Accordingly, a reduction in electrical performance of the bipolar transistor can be eliminated.

It is preferable that said bipolar transistor comprises a collector buried region formed in said first portion so as to extend into said second portion, and a collector drawn region formed in said second portion so as to connect with said collector buried region. Accordingly, the collector drawn region can be shallowed to thereby reduce lateral diffusion thereof. Therefore, a forming area of the collector drawn region can be reduced to contribute to the high integration of the elements.

Other objects and features of the invention will be more fully understood from the following detailed description and appended claims when taken with the accompanying drawings.

BRIEF DESCRIPTION OF THE DRAWINGS

FIGS. 10A to 10E are sectional views illustrating a manufacturing method for the Bi-CMOS device shown in FIG. 9;

FIGS. 12A to 12E are sectional views illustrating a manufacturing method for the Bi-CMOS device shown in FIG. 11;

FIGS. 15A to 15J are sectional views illustrating a manufacturing method for the Bi-CMOS device shown in FIG. 14;

FIG. 16 is a sectional view of a Bi-CMOS device according to a seventh preferred embodiment of the present invention; and FIGS. 17A to 17D are sectional views illustrating a manufacturing method for an element isolating region in the Bi-CMOS device shown in FIG. 16.

DETAILED DESCRIPTION OF THE PREFERRED EMBODIMENTS

A first preferred embodiment of the present invention will now be described with reference to FIG. 5.

Figure 5:
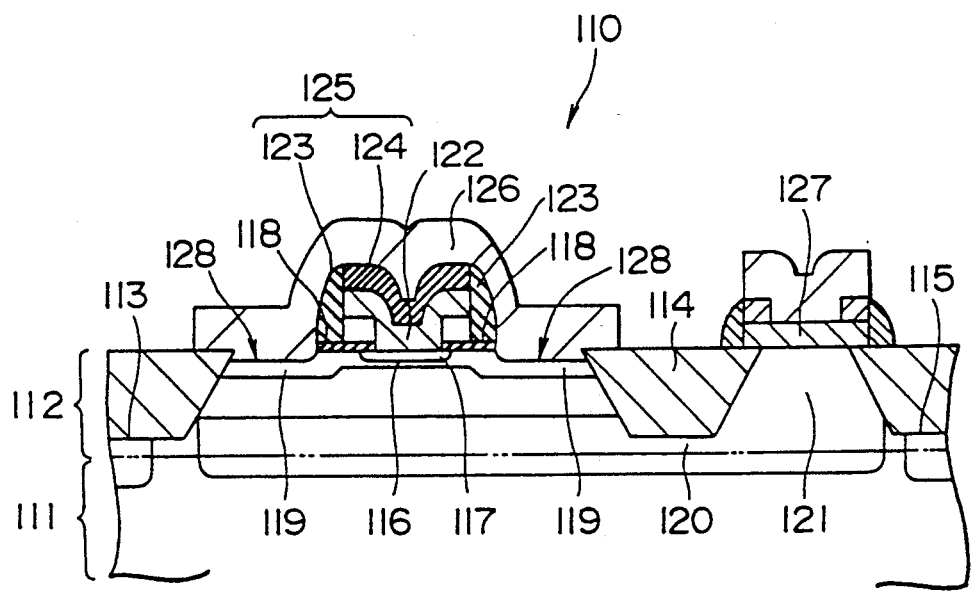
FIG. 5 is a sectional view of a bipolar transistor according to a first preferred embodiment of the present invention.

Referring to FIG. 5, reference numeral 110 generally designates an NPN bipolar transistor. A semiconductor layer 112 as an n-type epitaxial growth layer is formed on a semiconductor substrate 111 such as a p-type monocrystal silicon substrate. A plurality of element isolating regions 113, 114 and 115 are formed in the semiconductor layer 112.

A p-type base region 116 is formed at an upper portion of the semiconductor layer 112 between the element isolating regions 113 and 114. An $n^+$ emitter region 117 is formed at an upper portion of the p-type base region 116. An offset insulating film 118 (first insulating film) such as a silicon oxide film is formed on the p-type base region 116 around the $n^+$ emitter region 117. A $p^+$ graft base region 119 is formed at an upper portion of the semiconductor layer 112 around the p-type base region 116.

An $n^+$ collector buried region 120 is formed in the semiconductor layer 112 below the p-type base region 116. An $n^+$ collector drawn region 121 is formed in the semiconductor layer 112 so as to be connected to the $n^+$ collector buried region 120 and arranged the side of the p-type base region 116 adjacent to the element isolating region 114.

An emitter electrode 122 is formed on the $n^+$ emitter region 117 so as to be connected to the $n^+$ emitter region 117.

An emitter side wall insulating film 123 such as a silicon oxide film is formed on a side wall of the emitter electrode 122. A second insulating film 124 such as a silicon oxide film is formed on an upper surface of the emitter electrode 122. The emitter side wall insulating film 123 and the second insulating film 124 constitute an emitter insulating film 125.

A base electrode 126 is formed on the $p^+$ graft base region 119 so as to contact the emitter side wall insulating film 123.

A collector electrode 127 is formed on the $n^+$ collector drawn region 121.

Thus, the NPN bipolar transistor 110 has the above construction.

In the NPN bipolar transistor 110, the emitter side wall insulating film 123 is formed on the side wall of the emitter electrode 122, and the second insulating film 124 is formed on the upper surface of the emitter electrode 122, thereby insulating the emitter electrode 122 from the base electrode 126 with a space therebetween reduced. Accordingly, a distance between the emitter electrode 122 and a base contact portion 128 can be reduced. Further, a collector—base parasitic capacitance and a collector—substrate parasitic capacitance can be reduced to thereby enlarge a cut-off frequency and shorten a delay time.

Furthermore, contact between the emitter electrode 122 and the p+ graft base region 119 can be prevented.

A manufacturing method for the NPN bipolar transistor 110 will now be described with reference to FIGS. 6A to 6F.

Figure 6A:
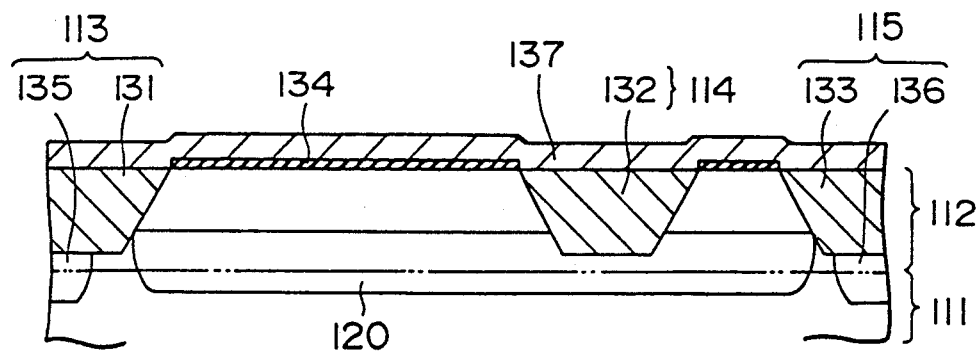
FIGS. 6A to 6F are sectional views illustrating a manufacturing method for the bipolar transistor shown in FIG. 5.

In the first step shown in FIG. 6A, an n-type impurity (e.g., antimony ions) is implanted into an upper portion of a semiconductor substrate 111 as a p-type monocrystal silicon substrate to form an n+ collector buried region 120 by a known method of forming a buried diffusion layer. Then, a semiconductor layer 112 as an n-type epitaxial growth layer is formed on an upper surface of the semiconductor substrate 111 by an epitaxial growth process.

Then, a plurality of LOCOS oxide films 131, 132 and 133 forming element isolating regions to be hereinafter described are formed at an upper portion of the semiconductor layer 112 by a LOCOS process.

Then, upper surfaces of the LOCOS oxide films 131 to 133 and the semiconductor layer 112 are flattened by an etch-back process.

Then, the upper surface of the semiconductor layer 112 except the LOCOS oxide films 131 to 133 is oxidized by a thermal oxidation process to form a first insulating film 134.

Then, boron ions are implanted through the LOCOS oxide films 131 and 133 into the semiconductor layer 122 below the LOCOS oxide films 131 and 133 by an ion implantation process using a resist mask (not shown) to form p+ element isolating diffusion layers 135 and 136 reaching the semiconductor substrate 111. Accordingly, the LOCOS oxide film 131 and the p+ element isolating diffusion layer 135 constitute an element isolating region 113, and the LOCOS oxide film 133 and the p+ element isolating diffusion layer 135 constitute an element isolating region 115. Further, the LOCOS oxide film 132 constitutes an element isolating region 114.

Then, a first polysilicon film 137 is formed on upper surfaces of the LOCOS oxide films 131 to 133 and the first insulating film 134 by a CVD process.

Figure 6B:
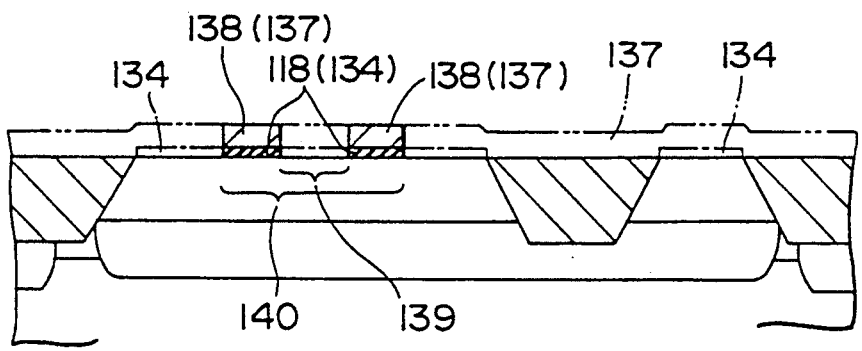

In the second step shown in FIG. 6B, a portion (shown by a two-dot chain line) of the first polysilicon film 137 is removed by a photolithography and etching process to form a mask pattern 138 as the remaining portion of the first polysilicon film 137.

Then, the first insulating film 134 is etched by an RIE process with the mask pattern 138 used as an etching mask to thereby remove a portion (shown by a one-dot chain line) of the first insulating film 134 and form an offset insulating film 118 as the remaining portion of the first insulating film 134 around an emitter forming region 139 on a base forming region 140.

Figure 6C:
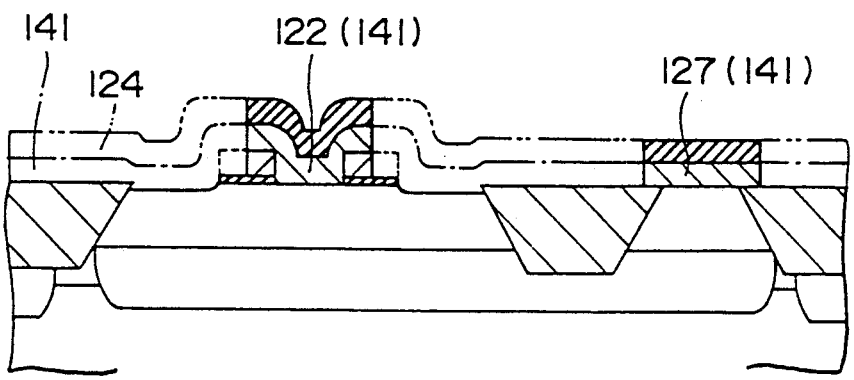

In the third step shown in FIG. 6C, a second polysilicon film 141 is formed on an entire upper surface of the semiconductor layer 112 so as to entirely cover the mask pattern 138 and the element isolating regions 113 to 115 by a CVD process. Then, a second insulating film 124 is formed on an entire upper surface of the second polysilicon film 141.

Then, a portion (shown by a two-dot chain line) of the second insulating film 124, a portion (shown by a one-dot chain line) of the second polysilicon film 141 and a portion (shown by a dashed line) of the mask pattern 138 are removed by a photolithography and RIE process to form an emitter electrode 122 and a collector electrode 127 as the remaining portion of the second polysilicon film 141.

Figure 6D:
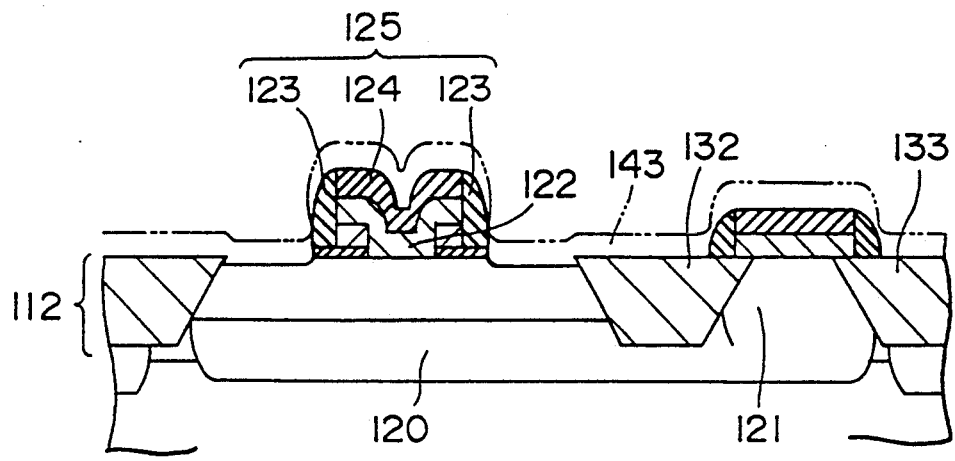

In the fourth step shown in FIG. 6D, arsenic ions are implanted into an upper portion of the semiconductor layer 112 between the LOCOS oxide films 132 and 133 by an ion implantation process using a resist mask (not shown) to form an n+ collector drawn region 121 connected to the n+ collector buried region 120.

Then, a third insulating film 143 such as a silicon oxide film is formed on an entire upper surface of the semiconductor layer 112 by a CVD process.

Then, a portion (shown by a two-dot chain line) of the third insulating film 143 is removed by an etch-back process to form an emitter side wall insulating film 123 as the remaining portion of the third insulating film 143 on a side wall of the emitter electrode 122. The emitter side wall insulating film 123 and the second insulating film 124 formed on an upper surface of the emitter electrode 122 constitute an emitter insulating film 125.

Figure 6E:
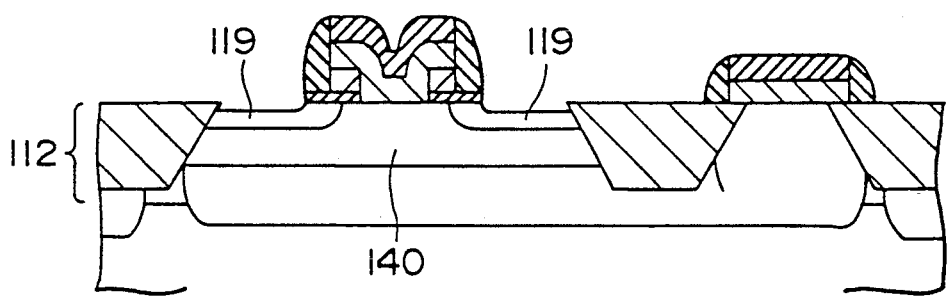

In the fifth step shown in FIG. 6E, boron ions are implanted into an upper portion of the semiconductor layer 112 by an ion implantation process using a resist mask (not shown) to form a p+ graft base region 119 at opposite side portions of the base forming region 140.

Figure 6F:
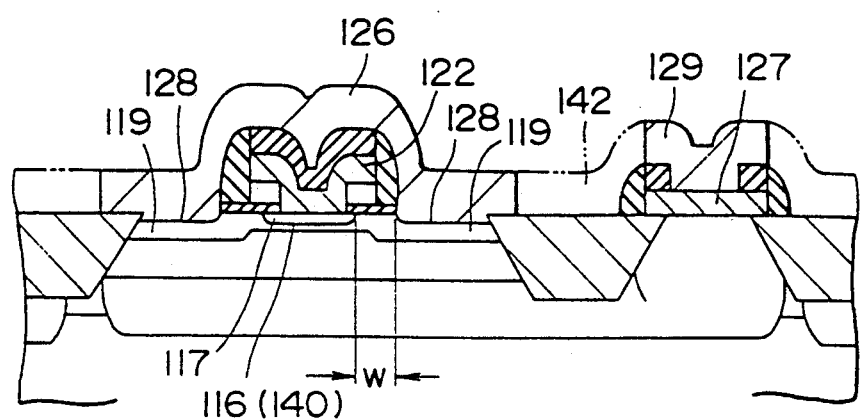

In the sixth step shown in FIG. 6F, boron ions are implanted into the emitter electrode 122 by an ion implantation process using a resist mask (not shown). Then, the boron ions in the emitter electrode 122 are diffused into the base forming region 140 by an impurity diffusion process to form a p-type base region 116.

Then, arsenic ions are implanted into the emitter electrode 122 by an ion implantation process using a resist mask (not shown). Then, the arsenic ions in the emitter electrode 122 are diffused into an upper portion of the p-type base region 116 to form an n+ emitter region 117.

Then, a metal film 142 is formed on an entire upper surface of the semiconductor layer 112. Then, a portion (shown by a two-dot chain line) of the metal film 142 is removed by a photolithography and etching process to form a base electrode 126 connected to the p+ graft base region 119 and a collector metal electrode 129 connected to the collector electrode 127 through a contact hole formed through the second insulating film 124 on the collector electrode 127.

The metal film 142 may be replaced by a polycide film. In the manufacturing method for the NPN bipolar transistor 110 mentioned above, a distance W between the emitter electrode 122 and the base contact portion 128 is decided in a self-alignment manner by utilizing the emitter side wall insulating film 123. Accordingly, the distance W between the emitter electrode 122 and the base contact portion 128 can be reduced to about 0.1 $\mu$m, thereby making a fine construction of elements.

A second preferred embodiment of the present invention will now be described with reference to FIG. 7.

Figure 7:
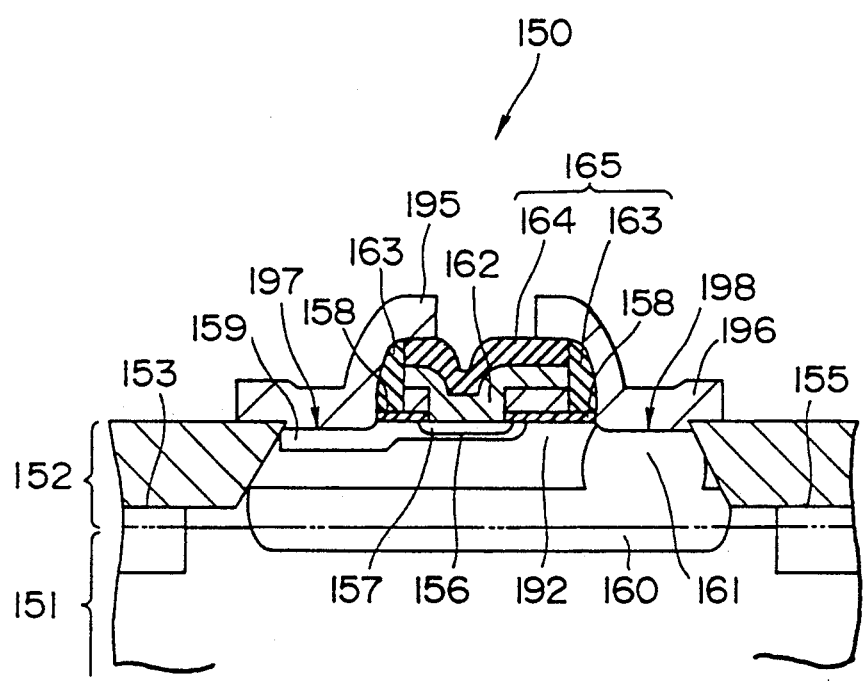
FIG. 7 is a sectional view of a bipolar transistor according to a second preferred embodiment of the present invention.

Referring to FIG. 7, reference numeral 150 generally designates an NPN bipolar transistor. A semiconductor layer 152 such as an n-type epitaxial growth layer is formed on a semiconductor substrate 151 such as a p-type monocrystal silicon substrate. A plurality of element isolating regions 153 and 155 are formed in the semiconductor layer 152.

A p-type base region 156 is formed at an upper portion of the semiconductor layer 152. An n+ emitter region 157 is formed at an upper portion of the p-type base region 156. An offset insulating film 158 (first insulating film) such as a silicon oxide film is formed on the p-type base region 156 around the emitter region 157 and on a portion 192 of the semiconductor layer 152 adjacent to the p-type base region 156.

A p+ graft base region 159 is formed at an upper portion of the semiconductor layer 152 on one side of the p-type base region 156 so as to be connected to the p-type base region 156.

An n+ collector buried region 160 is formed in the semiconductor layer 152 and the semiconductor substrate 151 below the p-type base region 156.

An n+ collector drawn region 161 is formed in the semiconductor layer 152 on the other side of the p-type base region 158 so as to be connected to the n+ collector buried region 160 and arranged on the side of the p-type base region 156 adjacent to the portion 192 of the semiconductor layer 152. An emitter electrode 162 is formed on the n+ emitter region 157 so as to be connected to the n+ emitter region 157. An emitter side wall insulating film 163 such as a silicon oxide film is formed on a side wall of the emitter electrode 162. A second insulating film 164 such as a silicon oxide film is formed on an upper surface of the emitter electrode 162. The emitter side wall insulating film 163 and the second insulating film 184 constitute an emitter insulating film 165.

A base electrode 195 is formed so as to be connected through the p+ graft base region 159 to the p-type base region 156 and contact one side of the emitter insulating film 165.

A collector electrode 196 is formed so as to be connected to the n+ collector drawn region 161 and contact the other side of the emitter insulating film 165.

Thus, the NPN bipolar transistor 150 has the above construction.

In the NPN bipolar transistor 150, the p+ graft base region 159 is formed on one side of the p-type base region 156, and the n+ collector drawn region 161 is formed on the other side of the p-type base region 156 through the portion 192 of the semiconductor layer 152. Accordingly, a distance between the emitter electrode 162 and a base contact portion 197 and a distance between the emitter electrode 162 and a collector contact portion 198 can be reduced to thereby reduce a distance between the emitter electrode 162 and the base electrode 195. Further, a collector—base parasitic capacitance and a collector—substrate parasitic capacitance can be reduced to thereby enlarge a cut-off frequency and shorten a delay time. Further, the elements can be made fine.

Furthermore, contact between the emitter electrode 162 and the p+ graft base region 159 and contact between the emitter electrode 162 and the n+ collector drawn region 161 can be prevented.

A manufacturing method for the NPN bipolar transistor 150 will now be described with reference to FIGS. 8A to 8D.

The first step is the same as that shown in FIG. 6A, and the second step is the same as that shown in FIG. 6B. However, an element isolating region corresponding to the element isolating region 114 in the first preferred embodiment is not formed in the second preferred embodiment. Therefore, the explanation of the first and second steps in the manufacturing method for the NPN bipolar transistor 150 will be omitted.

Figure 8A:
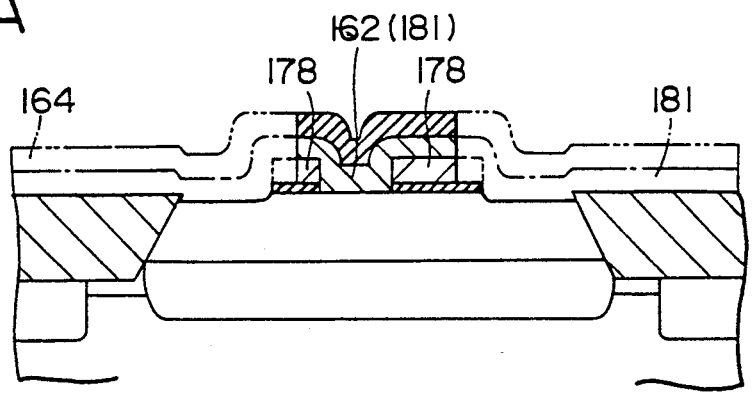
FIGS. 8A to 8D are sectional views illustrating a manufacturing method for the bipolar transistor shown in FIG. 7.

In the third step shown in FIG. 8A, a second polysilicon film 181 is formed on an entire upper surface of the semiconductor layer 152 so as to entirely cover a mask pattern 178 by a CVD process. Then, a second insulating film 164 is formed on an entire upper surface of the second polysilicon film 181.

Then, a portion (shown by a two-dot chain line) of the second insulating film 164, a portion (shown by a one-dot chain line) of the second polysilicon film 181 and a portion (shown by a dashed line) of the mask pattern 178 are removed by a photolithography and RIE process to form an emitter electrode 162 as the remaining portion of the second polysilicon film 181.

Figure 8B:
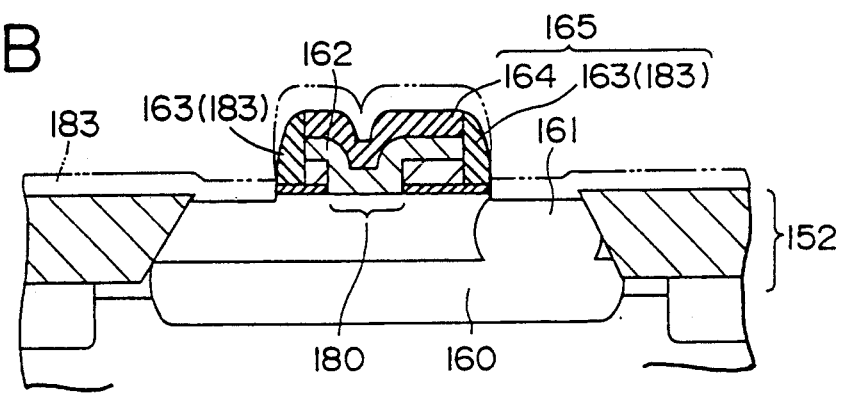

In the fourth step shown in FIG. 8B, arsenic ions are implanted into the semiconductor layer 152 by an ion implantation process using a resist mask (not shown) to form an n+ collector drawn region 161 connected to the n+ collector buried region 160 so that the n+ collector drawn region 161 is not connected to a base forming region 180.

Then, a third insulating film 183 such as a silicon oxide film is formed on the upper surface of the semiconductor layer 152 by a CVD process.

Then, a portion (shown by a two-dot chain line) of the third insulating film 183 is removed by an etch-back process to form an emitter side wall insulating film 163 as the remaining portion of the third insulating film 183 on a side wall of the emitter electrode 162. The emitter side wall insulating film 163 and the second insulating film 164 formed on an upper surface of the emitter electrode 162 constitute an emitter insulating film 165.

Figure 8C:
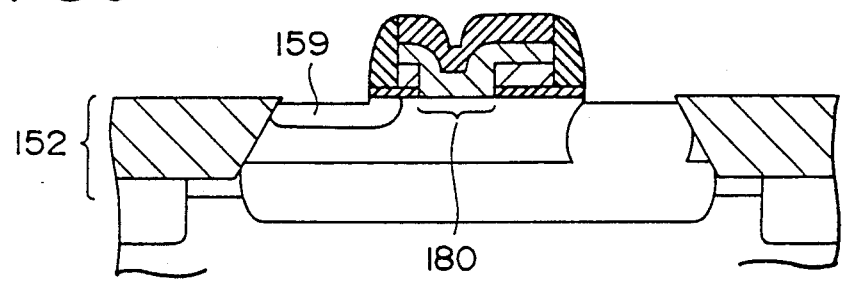

In the fifth step shown in FIG. 8C, boron ions are implanted into an upper portion of the semiconductor layer 152 by an ion implantation process using a resist mask (not shown) to form a p+ graft base region 159 at one side portion of the base forming region 180.

Figure 8D:
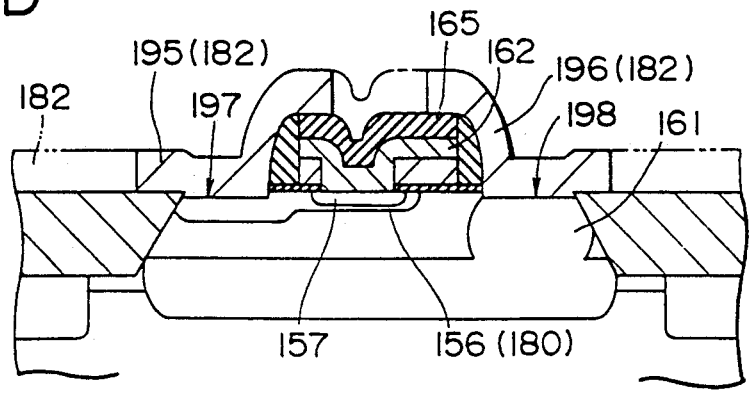

In the sixth step shown in FIG. 8D, boron ions are implanted into the emitter electrode 162 by an ion implantation process using a resist mask (not shown). Then, the boron ions in the emitter electrode 162 are diffused into the base forming region 180 by an impurity diffusion process to form a p-type base region 156.

Then, arsenic ions are implanted into the emitter electrode 162 by an ion implantation process using a resist mask (not shown). Then, the arsenic ions in the emitter electrode 162 are diffused into an upper portion of the p-type base region 156 to form an n+ emitter region 157.

Then, a metal film 182 is formed on an entire upper surface of the semiconductor layer 152. Then, a portion (shown by a two-dot chain line) of the metal film 182 is removed by a photolithography and etching process to form a base electrode 195 connected to the p+ graft base region 159 so that the base electrode 195 contacts one side of the emitter insulating film 165 and to simultaneously form a collector electrode 196 connected to the n+ collector drawn region 161 so that the collector electrode 196 contacts the other side of the emitter insulating film 165.

In the manufacturing method for the NPN bipolar transistor 150, a distance between the emitter electrode 162 and a base contact portion 197 and a distance between the emitter electrode 162 and a collector contact portion 198 are decided in a self-alignment manner by utilizing the emitter side wall insulating film 163. Accordingly, the distance between the emitter electrode 162 and the base contact portion 197 can be reduced to about 0.1 μm, thereby making the element fine.

Each of the NPN bipolar transistors 110 and 150 can be mounted as a bipolar transistor on a Bi-CMOS device.

The manufacturing method mentioned above in each of the first and second preferred embodiments can be adopted to form a Bi-CMOS device. In this case, the following advantages can be effected.

(1) A gate insulating film of a CMOS transistor and the offset insulating film of the bipolar transistor can be simultaneously formed from the first insulating film.

(2) A gate of the CMOS transistor and the emitter electrode of the bipolar transistor can be simultaneously formed.

(3) An LDD side wall insulating film for an LDD diffusion layer of the CMOS transistor and the emitter side wall insulating film of the bipolar transistor can be simultaneously formed.

Accordingly, a Bi-CMOS device can be formed by combining a CMOS device with the bipolar transistor which can be easily highly integrated, without largely increasing a manufacturing step.

A third preferred embodiment of the present invention will now be described with reference to FIG. 9.

Figure 9:
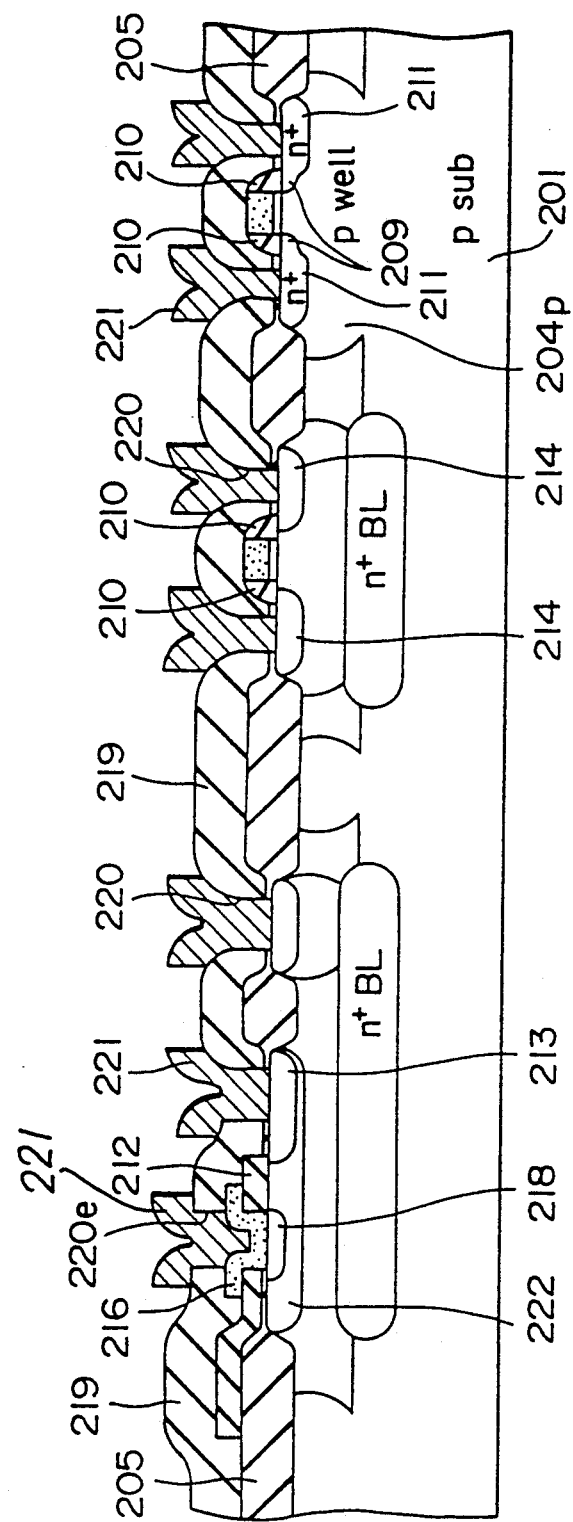
FIG. 9 is a sectional view of a Bi-CMOS device according to a third preferred embodiment of the present invention.

FIG. 9 shows a Bi-CMOS device according to the third preferred embodiment. The Bi-CMOS device shown in FIG. 9 is different from the prior art Bi-CMOS device shown in FIG. 3 in the points that an emitter window opening insulating film 212 is formed on only a portion of a base region 222 except a base drawn region 213 and that a thickness of the film 212 is considerably large. Owing to this difference, the Bi-CMOS device according to the third preferred embodiment can exhibit a specific effect that cannot be obtained by the prior art Bi-CMOS device shown in FIG. 3. The other parts of the Bi-CMOS device shown in FIG. 9 are common to those of the prior art Bi-CMOS device shown in FIG. 3, so that the explanation of such common parts will be omitted and the different parts only will be described below.

Figure 1:
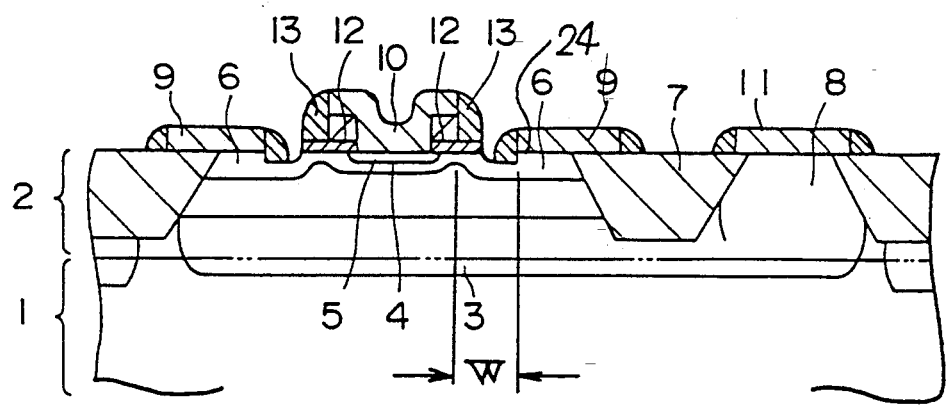
FIG. 1 is a sectional view of a bipolar transistor in the prior art.
Figure 2A:
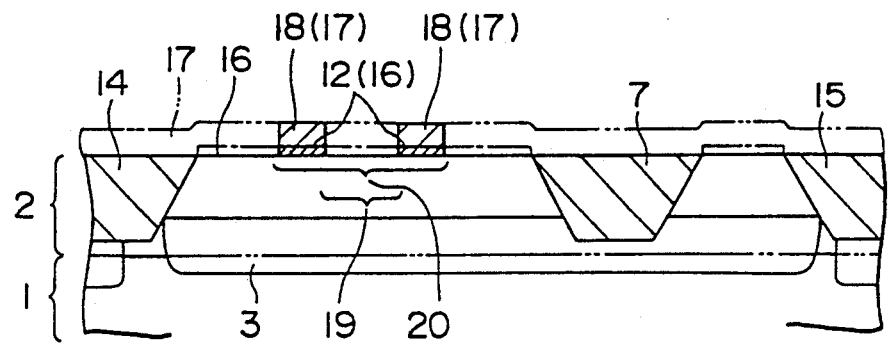
FIGS. 2A to 2C are sectional views illustrating a manufacturing method for the bipolar transistor shown in FIG. 1.
Figure 2B:
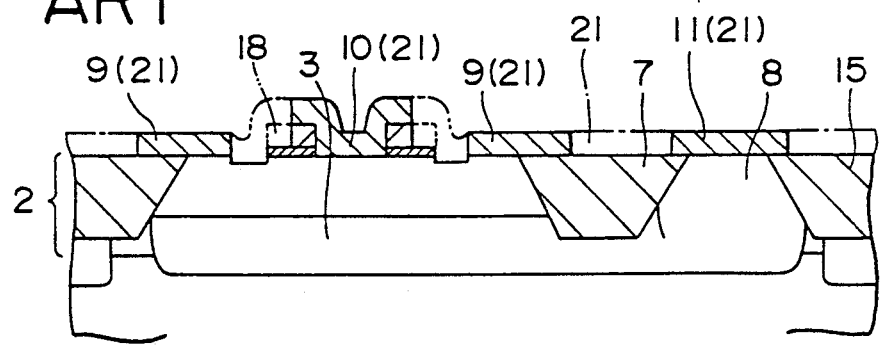
Figure 2C:
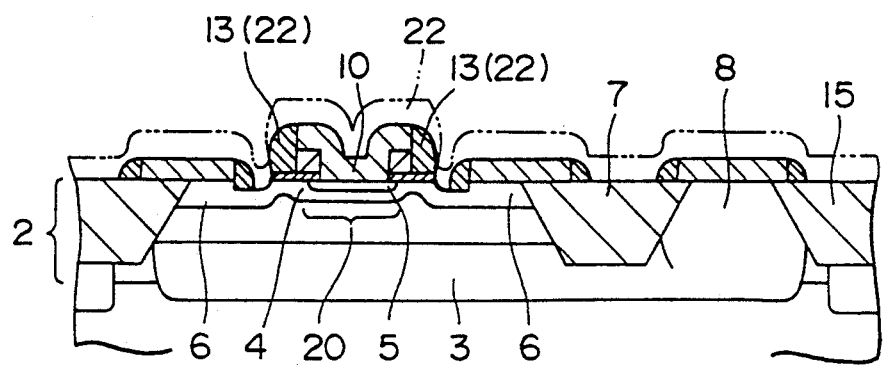
Figure 3:
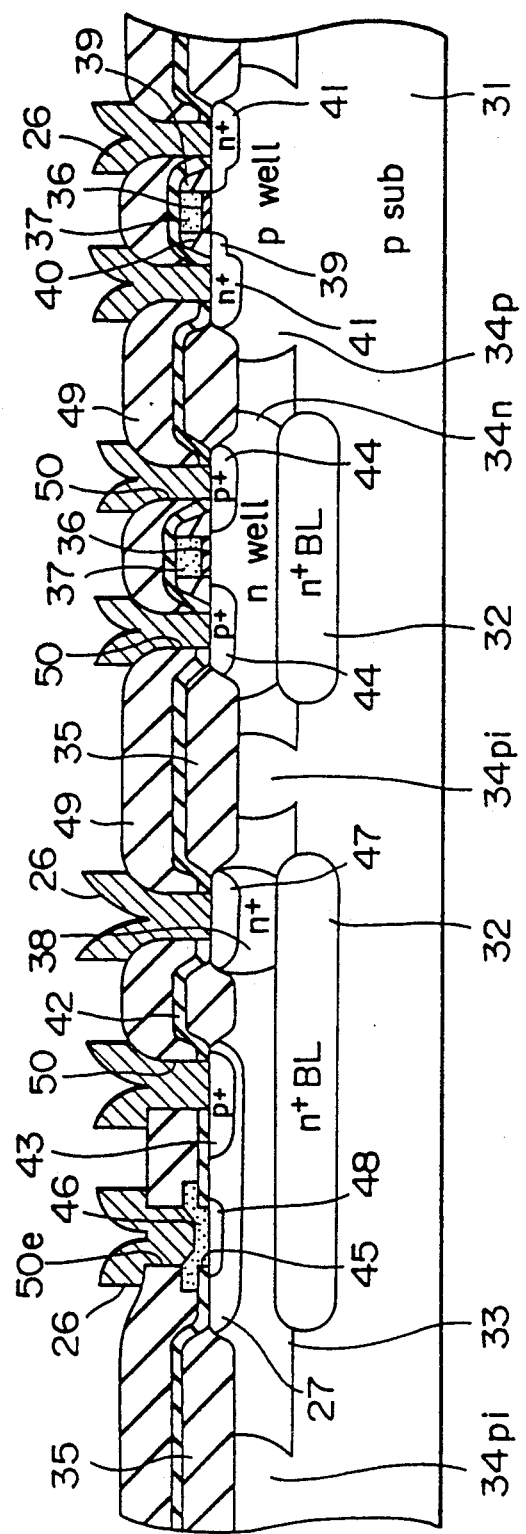
FIG. 3 is a sectional view of a Bi-CMOS device in the prior art.
Figure 4:
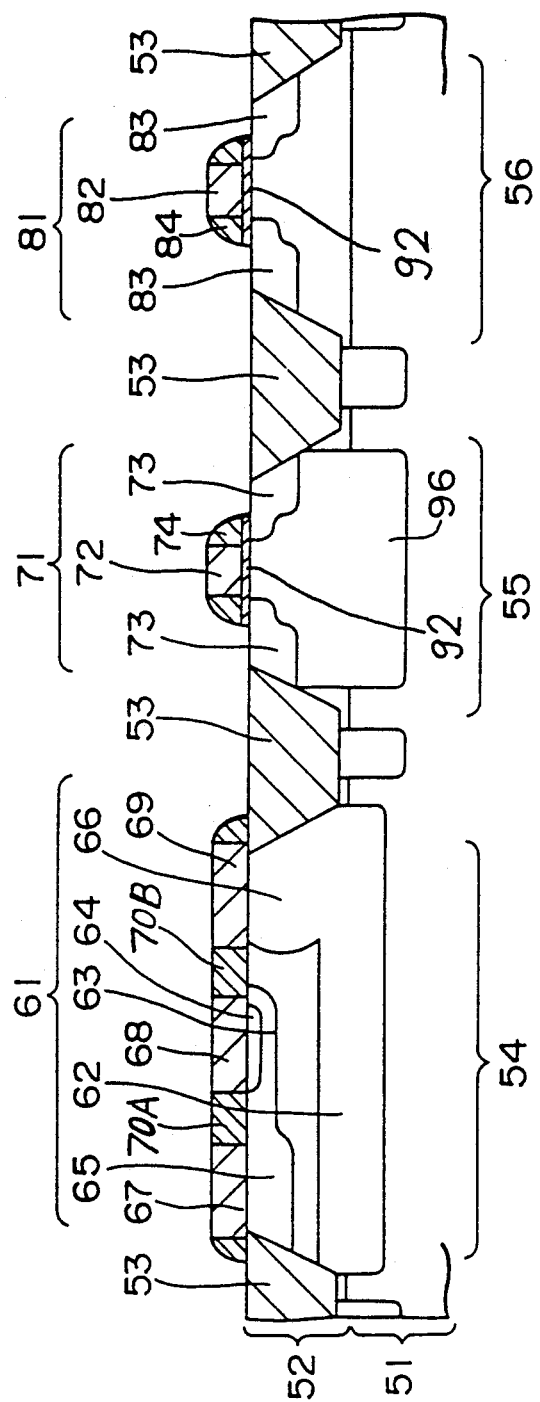
FIG. 4 is a sectional view of another Bi-CMOS device in the prior art.

While such an emitter window opening insulating film is formed in the prior art Bi-CMOS device shown in FIG. 3, the emitter window opening insulating film 212 of the Bi-CMOS device in the third preferred embodiment is formed on only a portion of the base region 222 except the base drawn region 213. However, this film 212 extends over a selective oxide film 205.

The emitter window opening insulating film 212 and gate side wall insulating films 210 for gate electrodes 207 of the CMOS transistor are formed from the same silicon oxide layer. Accordingly, the thickness (200–300 nm) of the insulating film 212 is considerably larger than that (100 nm) in the prior art.

The gate side wall insulating films 210 are formed by anisotropic etching of the same silicon oxide layer, and the emitter window opening insulating film 212 remains on a portion of the base region 222 except the base drawn region 213 in spite of the anisotropic etching for the formation of the gate side wall insulating films 210. Accordingly, the portion of the base region 222 except the base drawn region 213 is not damaged by the anisotropic etching. Therefore, there is no possibility that a leakage current of the base will become large because of the anisotropic etching for the formation of the gate side wall insulating films 210, so that a leakage current of the bipolar transistor can be reduced.

Further, since the emitter window opening insulating film 212 is formed on only the portion of the base region 222 except the base drawn region 213, the depths of contact holes 220 and 220e formed through an interlayer insulating film 219 can be made substantially equal to each other. That is, the depths of the contact holes 220 can be reduced by the thickness of the prior art emitter window opening insulating film.

Accordingly, the emitter contact hole 220e can be formed without overetching an emitter polysilicon layer 216. Accordingly, there is no possibility that the emitter polysilicon layer 215 will become thin to cause penetration of an electrode 221 through the emitter polysilicon layer 216.

As a result, the emitter window opening insulating film 212. can be made thick, so that a parasitic capacitance between the base region 222 and an extended portion of the emitter polysilicon layer 216 extending from an emitter window can be reduced.

Since the emitter window opening insulating film 212 is not formed on the base drawn region 213, ion implantation for the formation of the base drawn region 213 can be performed not through the emitter window opening insulating film 212 even after emitter diffusion. That is, even after forming an emitter region 218, the ion implantation can be performed to obtain a high dose of ions to be implanted.

Accordingly, i t is possible to eliminate the prior art problem that the base drawn region is expanded by emitter diffusion to cause a difficulty of shallowing of the base region. Accordingly, a collector—base parasitic capacitance can be reduced.

A manufacturing method for the Bi-CMOS device shown in FIG. 9 will now be described with reference to FIGS. 10A to 10E.

In the first step shown in FIG. 10A, a p-type semiconductor substrate (e.g., monocrystal silicon having a crystal orientation of $<100>$) is prepared, and n+ buried layers 202 are formed at a bipolar transistor forming portion and a p-type MOS transistor forming portion of the semiconductor substrate. Then, an n-type epitaxial growth layer 203 (resistivity $\rho = 1.0$ Ω.cm; thickness of 1.5 nm) is formed at the bipolar transistor forming portion; an n-type well 204n is formed at the p-type MOS transistor forming portion; and p-type wells 204p and 204pi are formed in an n-type MOS transistor forming portion and an isolation portion, respectively.

Then, selective oxide films 205 having a thickness of 500–600 nm are formed, and thereafter gate insulating films 206 having a thickness of 20–30 nm are formed.

In the second step shown in FIG. 10B, gate electrodes 207 having a thickness of 300 nm, formed of n-type polysilicon, are formed at gate forming portions of the p-type MOS transistor and the n-type MOS transistor, respectively.

Then, an n+ collector drawn region 208 is formed by ion implantation of an n-type impurity, e.g., phosphorus. Then, a base region 222 is formed by ion implantation of a p-type impurity, e.g., boron, using a resist film as a mask. Then, n-LDD regions 209 of the n-type MOS transistor are formed by ion implantation of an n-type impurity, e.g., phosphorus, using a resist film as a mask.

Figure 10C:
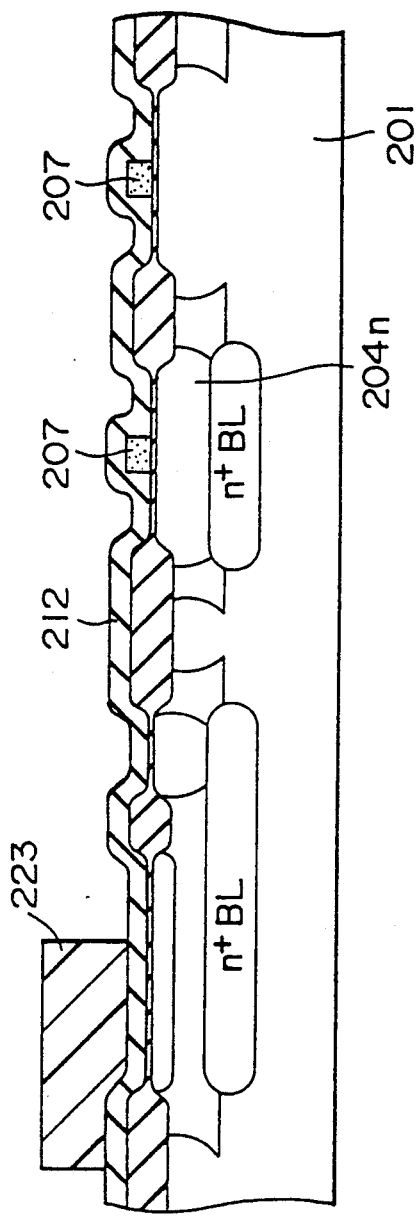

In the third step shown in FIG. 10C, an insulating film 212 having a thickness of 200–300 nm is entirely formed by a CVD process. This insulating film 212 will be later formed into an emitter window opening insulating film in the bipolar transistor and into gate side wall insulating films 210 for the gate electrodes 207 in the n-type and p-type MOS transistors.

Then, a portion of the insulating film 212 on a portion of the base region 222 except a base drawn region (which will be hereinafter described) is masked by a resist film 223.

Figure 10D:
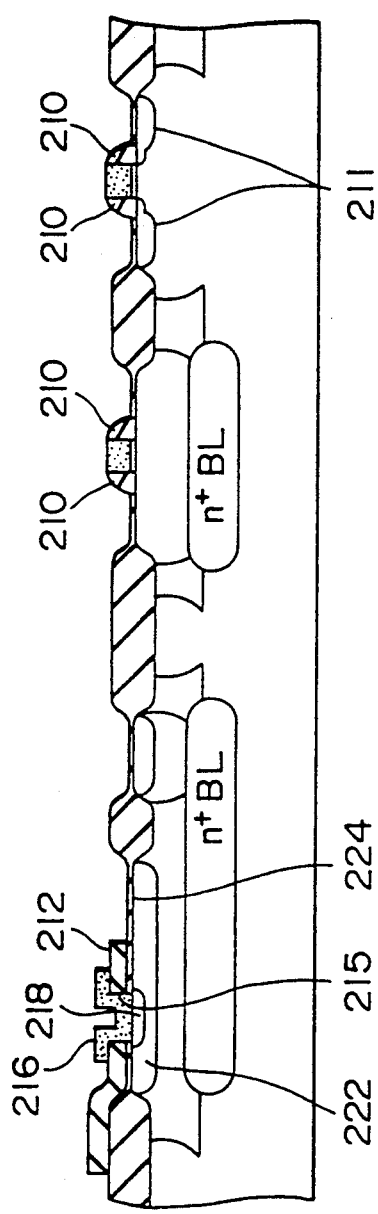

In the fourth step shown in FIG. 10D, anisotropic etching (15% overetching) is performed to the insulating film 212 to form an emitter window opening insulating film 212 under the resist film 223 and gate side wall insulating films 210 on side walls of the gate electrodes 207 in the n-type and p-type MOS transistors.

It is important that the emitter window opening insulating film 212 is covered with the resist film 223 on an intrinsic portion of the base region 222 when forming the gate side wall insulating films 210 by the anisotropic etching. That is, the intrinsic portion of the base region 222 is not damaged by the anisotropic etching, thereby hindering an increase in leakage current.

Then, an insulating film 224 having a thickness of about 15 nm is entirely formed, and source and drain 211 of the n-type MOS transistor are formed by ion implantation of an n-type impurity, e.g., arsenic, using a resist film as a mask.

Then, an emitter window (opening) 215 is formed by selective etching such as wet etching or RIE to the emitter window opening insulating film 212. Then, an emitter polysilicon layer 216 having a thickness of 100-150 nm is formed by a CVD process, and arsenic ions are implanted into the emitter polysilicon layer 216, which is then patterned.

The emitter polysilicon layer 216 is so formed as to fully cover the emitter window 215 in such a manner as to extend over the emitter window 215. Accordingly, such an extending portion of the emitter polysilicon layer 216 overlaps the base region 222 to make a capacitance. However, as the emitter window opening insulating film 212 forming a dielectric is thick, the capacitance becomes small, and a high operating speed is therefore not reduced.

Then, the n-type impurity in the emitter polysilicon layer 216 is diffused by heating into a surface portion of the base region 222 to form an emitter region 218.

Figure 10E:
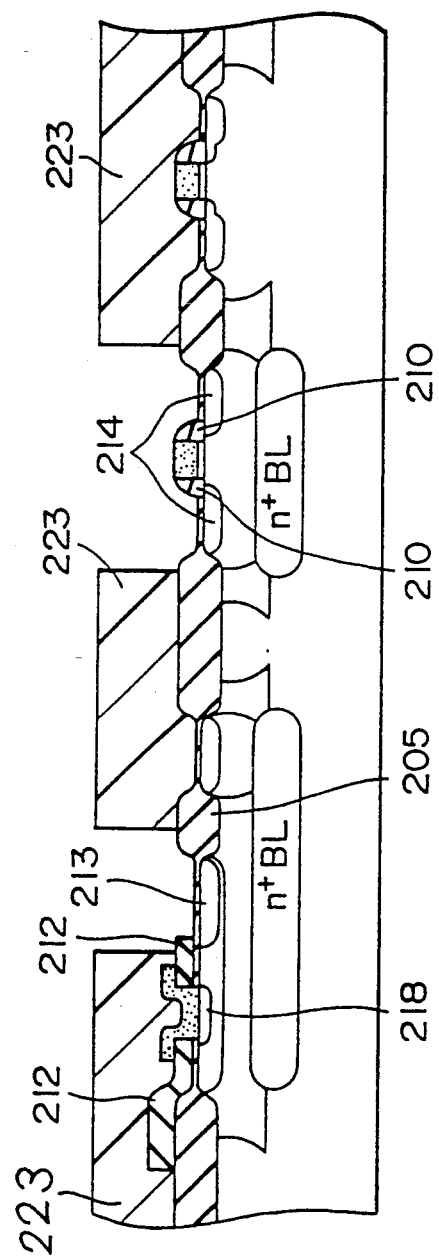

In the fifth step shown in FIG. 10E, a p+ base drawn region 213 of the bipolar transistor and p+ source and drain 214 of the p-type MOS transistor are simultaneously formed by ion implantation of a p-type impurity, e.g., boron, using a resist film 223 as a mask. Since the base drawn region 213 can be formed in a self-alignment manner such that the emitter window opening insulating film 212 and the selective oxide film 205 serve as a mask, a pattern of the resist film 223 is unnecessary to be so highly accurate.

It is important that the base drawn region 213 is formed after the formation of the emitter region 218 by diffusion. Therefore, it is possible to elminate the problem that the base drawn region 213 will be unduly diffused to be expanded by heating to be carried out for the formation of the emitter region 218. Accordingly, the base drawn region 213 can be shallowed to thereby naturally reduce a collector—base capacitance and improve the characteristics.

Furthermore, it is also important that the base drawn region 213 of the bipolar transistor and the p+ source and drain 214 of the p-type MOS transistor are simultaneously formed. Therefore, like the base drawn region 213, it is possible to eliminate the problem that the p+ source and drain 214 of the p-type MOS transistor will be unduly diffused to be expanded by heating to be carried out for the formation of the emitter region 218. Accordingly, the p-type MOS transistor can be reduced in size.

Thereafter, a thick interlayer insulating film 219 of BPSG or the like is entirely formed, and contact holes 220e and 220 are then formed through the interlayer insulating film 219. It is important that the emitter window opening insulating film 212 is present on only the intrinsic portion of the base region 222, the depth of the emitter contact hole 220e is substantially equal to the depths of the other contact holes 220. That is, it is unnecessary to overetch the interlayer insulating film 219 for the formation of the emitter contact hole 220e. Accordingly, it is possible to eliminate the problem that the emitter polysilicon layer 216 will become thin because of the overetching to cause penetration of an electrode 221 (to be formed later) through the layer 216.

Then, the interlayer insulating film 219 is flattened by reflowing, and electrodes 221 are formed so as to fill the contact holes 220e and 220.

A fourth preferred embodiment of the present invention will now be described with reference to FIG. 11.

Figure 11:
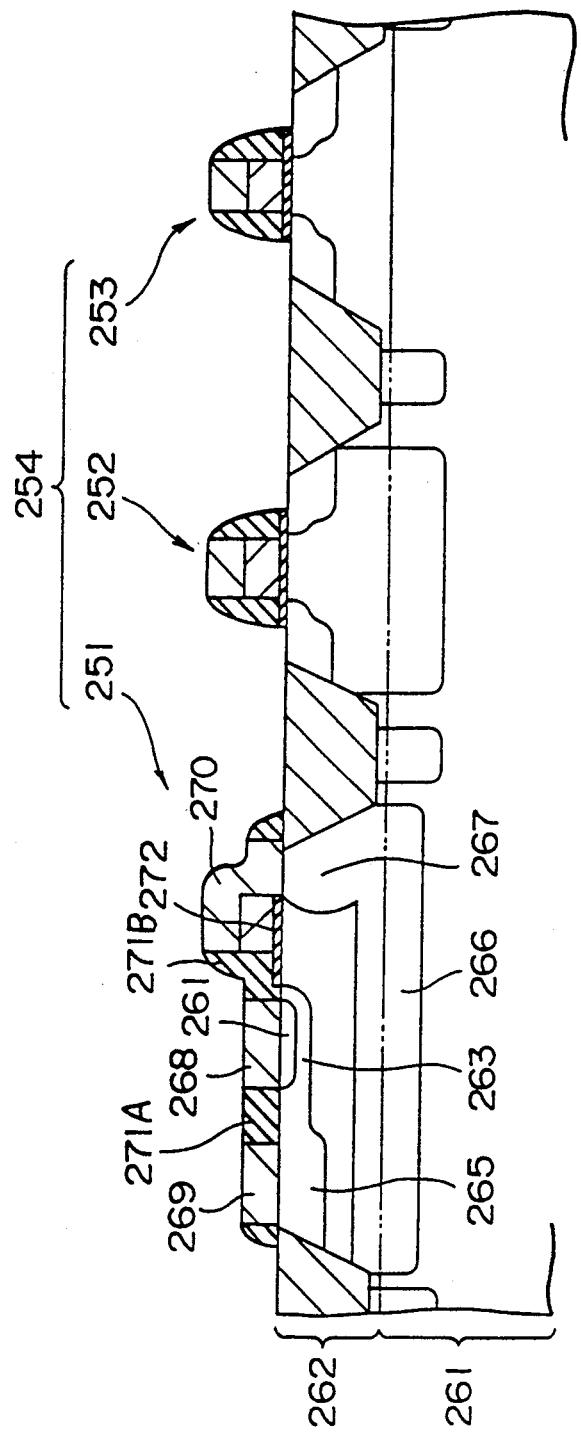
FIG. 11 is a sectional view of a Bi-CMOS device according to a fourth preferred embodiment of the present invention.

Referring to FIG. 11, reference numeral 254 generally designates a Bi-CMOS device consisting of an NPN bipolar transistor 251, an n-type MOS transistor 252 and a p-type MOS transistor 253. An n-type epitaxial growth layer is formed as a semiconductor layer 262 on an upper surface of a semiconductor substrate 261 such as a p-type monocrystal silicon substrate. The NPN bipolar transistor 251 is formed in the semiconductor layer 262.

The NPN bipolar transistor 251 has the following structure. That is, a p-type base region 263 is formed at an upper portion of the semiconductor layer 262. An n+ emitter region 264 is formed at an upper portion of the p-type base region 263. A p+ graft base region 265 is formed at the upper portion of the semiconductor layer 262 on one side of the p-type base region 263. An n+ collector buried region 266 is formed in the semiconductor layer 262 below the p-type base region 263. An n+ collector drawn region 267 is formed in the semiconductor layer 262 so as to be connected with the n+ collector buried region 266.

Further, an emitter electrode 268 is formed on an upper surface of the semiconductor layer 262 so as to be connected with the n+ emitter region 264. A base electrode 269 is formed on the upper surface of the semiconductor layer 262 so as to be connected with the p+ graft base region 265. A collector electrode 270 is formed on the upper surface of the semiconductor layer 262 so as to be connected with the n+ collector drawn region 267. An interelectrode 271A is formed between the base electrode 269 and the emitter electrode 268, and another interelectrode insulating film 271B is formed between the emitter electrode 268 and the collector electrode 270. An offset insulating film 272 is formed below a partial lower surface of the collector electrode 270 on the emitter electrode 268 side so as to be connected with the interelectrode insulating film 271B formed between the emitter electrode 268 and the collector electrode 270.

Thus, the NPN bipolar transistor 251 has the above construction.

Owing to the provision of the offset insulating film 272, a distance between the base and the collector contact can be sufficiently ensured. Accordingly, voltage resistance between the base and the collector contact of the bipolar transistor 251 can be easily ensured, thereby preventing a reduction in voltage resistance between the emitter and the collector.

A manufacturing method for the Bi-CMOS device 254 having the bipolar transistor 251 will now be described with reference to FIGS. 12A to 12E.

In the first step shown in FIG. 12A, an n+ collector buried region 266 is formed at an upper portion of a semiconductor substrate 261 such as a p-type monocrystal silicon substrate by an ion implantation process.

Then, a semiconductor layer 262 as an n-type epitaxial growth layer is formed on an upper surface of the semiconductor substrate 261 by an epitaxial growth process. At this time, an impurity in the n+ collector buried region 266 is diffused into a lower portion of the semiconductor layer 262.

Then, a plurality of element isolating regions 273 are formed at an upper portion of the semiconductor layer 262 by a LOCOS process. Then, the upper surface of the semiconductor layer 262 including the upper surfaces of the element isolating regions 273 is flattened by an etch-back process.

Then, the upper surface of the semiconductor layer 262 in a bipolar transistor forming region 255 and a CMOS transistor forming region 262 is oxidized by a thermal oxidation process to form a first insulating film 274 such as a silicon oxide film.

Then, a first polysilicon film 275 is formed on the entire upper surface of the semiconductor layer 262 so as to cover the first insulating film 274 by a CVD process.

In the second step shown in FIG. 12B, a portion (shown by a two-dot chain line) of the first polysilicon film 275 is removed by a photolithography and etching process to form a first pattern 276 at a portion of the bipolar transistor forming region 255 from the first polysilicon film 275 and also form a second pattern 277 covering the CMOS transistor forming region 256 from the first polysilicon film 275.

Then, a portion (shown by a one-dot chain line) of the first insulating film 274 is removed by an RIE process with the first and second patterns 276 and 277 used as an etching mask. Thus, an offset insulating film 272 is formed as the remaining portion of the first insulating film 274 in the bipolar transistor forming region 255.

In the third step shown in FIG. 12C, a second polysilicon film 279 is formed on the entire upper surface of the semiconductor layer 262 so as to cover the first and second patterns 276 and 277.

In the fourth step shown in FIG. 12D, a portion (shown by a two-dot chain line) of the second polysilicon film 279 and a portion (shown by a one-dot chain line) of the first and second patterns 276 and 277 are removed by a photolithography and etching process to form a base electrode 269, an emitter electrode 268 and a collector electrode 270 in the bipolar transistor forming region 255 and also form gates 280 and 281 in the CMOS transistor forming region 256.

Figure 12E:
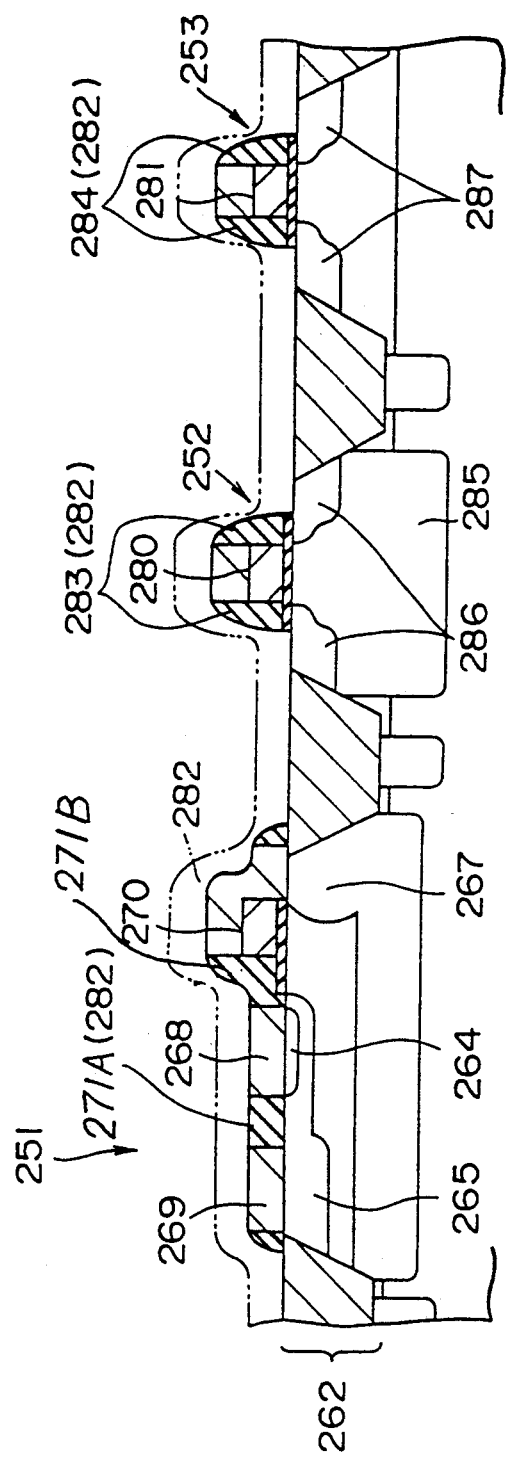

In the fifth step shown In FIG. 12E, a second insulating film 282 such as a silicon oxide film is formed on the entire upper surface of the semiconductor layer 262 by a CVD process.

Then, a portion (shown by a two-dot chain line) of the second insulating film 282 is removed by an etch-back process to form an interelectrode insulating film 271A between the base electrode 269 and the emitter electrode 268 and another interelectrode insulating film 271B between the emitter electrode 268 and the collector electrode 270 and also form gate side wall insulating films 283 and 284 on side walls of the gates 280 and 281, respectively.

It is to be noted that there have not been described the steps of forming a p+ base region 263, n+ emitter region 265, p+ graft base region and n+ collector drawn region 267 to be formed in the NPN bipolar transistor 251, a p-type well region 285 to be formed in the n-type MOS transistor 252, and source and drain regions 286 and 287 to be respectively formed in the n-type and p-type MOS transistors 252 and 253.

Figure 13:
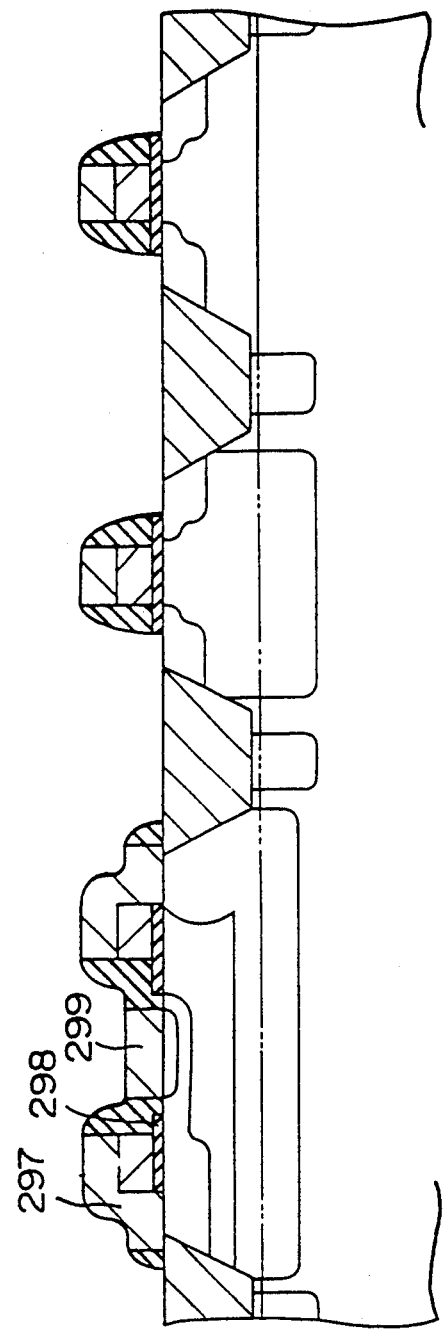
FIG. 13 is a sectional view of a Bi-CMOS device according to a fifth preferred embodiment of the present invention.

FIG. 13 shows a fifth preferred embodiment of the present invention as a modification of the fourth preferred embodiment. As shown in FIG. 13, an offset insulating film 298 is formed below a partial lower surface of a base electrode 297 on an emitter electrode 299 side. The other parts are the same as those in the fourth preferred embodiment.

In the fifth preferred embodiment, a base - emitter parasitic capacitance can be reduced.

A sixth preferred embodiment of the present invention will now be described with reference to FIG. 14.

Figure 14:
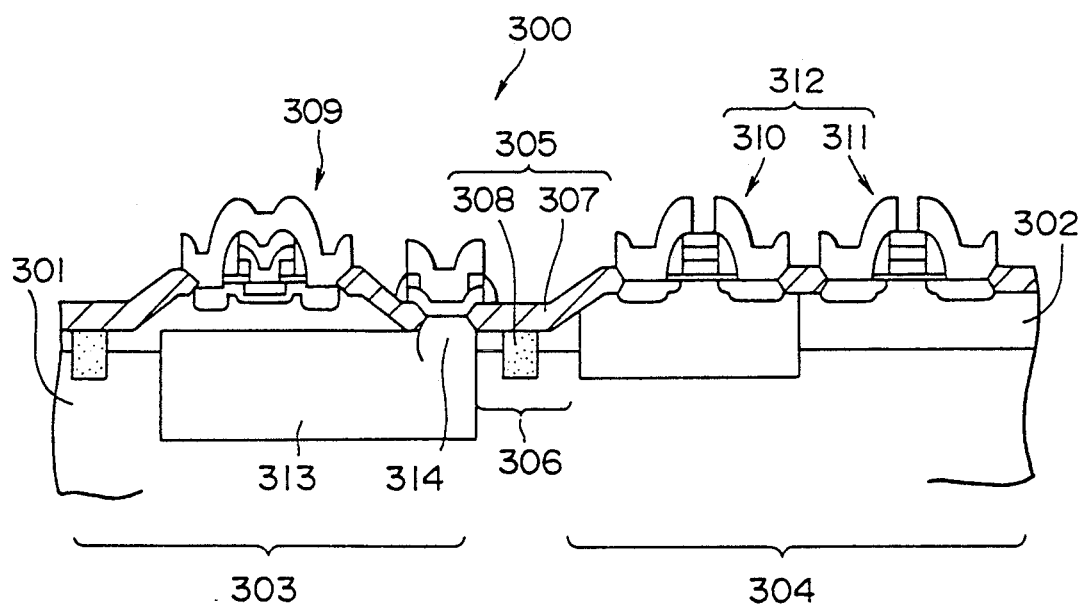
FIG. 14 is a sectional view of a Bi-CMOS device according to a sixth preferred embodiment of the present invention.

Referring to FIG. 14, reference numeral 301 designates a semiconductor substrate such as a p-type monocrystal silicon substrate. An n-type semiconductor layer 302 is formed on an upper surface of the semiconductor substrate 301. The semiconductor layer 302 is formed with a bipolar transistor forming region 303, a CMOS transistor forming region 304 and an element isolating region 305 isolating the bipolar transistor forming region 303 from the CMOS transistor forming region 304. A portion 306 of the semiconductor layer 302 where the element isolating region 305 is formed is thinner than the other portion of the semiconductor layer 302 where the bipolar transistor forming region 303 and the CMOS transistor forming region 304 are formed. This thin portion 306 of the semiconductor layer 302 has a thickness of about 0.4 μm, and the other portion of the semiconductor layer 302 has a thickness of about 1.0 μm. This thin portion 306 of the semiconductor layer 302 will be hereinafter referred to as a thin layer portion 306.

Thus, the element isolating region 305 isolating the bipolar transistor forming region 303 from the CMOS transistor forming region 304 is formed at the thin layer portion 306. This element isolating region 305 is constituted of a LOCOS oxide film 307 having a thickness of about 0.4 μm and a p+ element isolating diffusion layer 308 formed below a lower surface of the LOCOS oxide film 307 so as to reach the semiconductor substrate 301.

An NPN bipolar transistor 309 is formed in the bipolar transistor forming region 303 of the semiconductor layer 302, and a CMOS transistor 312 consisting of an n-type MOS transistor 310 and a p-type MOS transistor 311 is formed in the CMOS transistor forming region 304 of the semiconductor layer 302.

Thus, a Bi-CMOS device 300 having the NPN bipolar transistor 309 and the CMOS transistor 312 is constructed.

The semiconductor layer 302 of the Bi-CMOS device 300 is an n-type epitaxial growth layer formed by growing silicon from the semiconductor substrate 301. Alternatively, the semiconductor layer 302 may be an n-type well region formed by introducing an n-type impurity into an upper layer of the semiconductor substrate 301 by an ion implantation process.

An n+ collector buried region 313 is formed in the semiconductor substrate 301 and the semiconductor layer 302 so as to extend to the thin layer portion 306. Further, an n+ collector drawn region 314 is formed in the thin layer portion 306 so as to be connected with the n+ collector buried region 313.

A manufacturing method for the element isolating region 305 in the Bi-CMOS device 300 will now be described with reference to FIGS. 15A to 15D.

In the first step shown in FIG. 15A, an n+ collector buried region 313 is formed in an upper layer of a semiconductor substrate 301 by a known method of forming a buried diffusion layer. The semiconductor substrate 301 is a monocrystal silicon substrate having a crystal orientation of <100>, for example. Then, a semiconductor layer 302 as an n-type epitaxial growth layer ($\rho=1.0$ $\Omega$.cm) having a thickness of 1.0 $\mu$m is formed on an upper surface of the semiconductor substrate 301 by an epitaxial growth process.

In the second step shown in FIG. 15B, an etching mask 315 is formed from a resist film by a photolithography process so as to cover the semiconductor layer 302 except a portion thereof where an element isolating region (not shown) for isolating a bipolar transistor forming region 303 from a CMOS transistor forming region 304. Then, a portion (shown by a two-dot chain line) of the semiconductor layer 302 is removed by a dry etching process to form a thin layer portion 306. The dry etching process is an RIE process using a mixed gas of silicon tetrachloride (SiCl4) and nitrogen (N2) as an etching gas. By the dry etching process, tapering stepped portions 316 are formed on the opposite sides of the thin layer portion 306. Further, an etching depth is set to about 600 nm. Then, the etching mask 315 is removed by an ashing process.

Figure 15C:
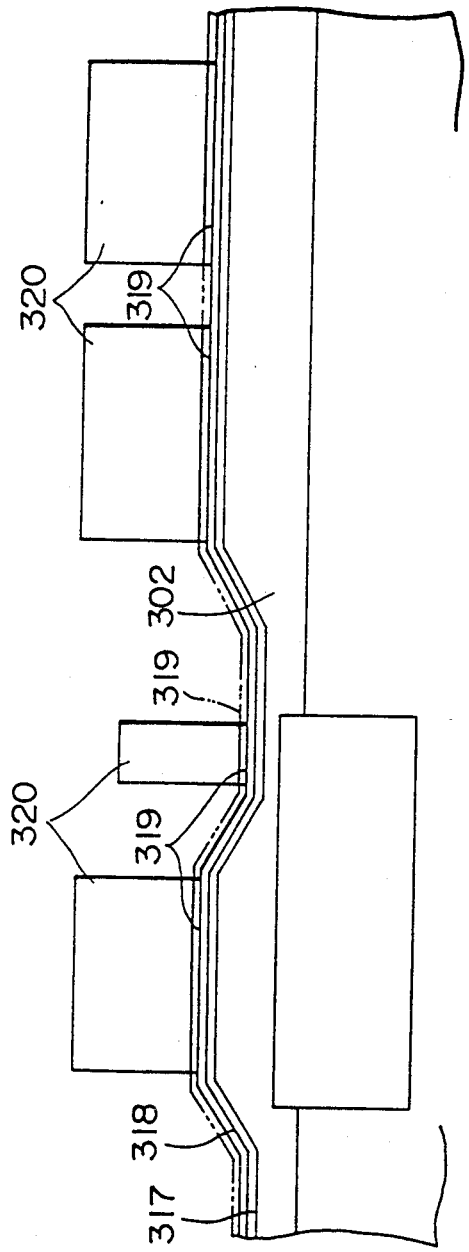

In the third step shown in FIG. 15C, an upper surface of the semiconductor layer 302 is thermally oxidized in a dry oxygen atmosphere at 850° C. to form a silicon oxide film 317 having a thickness of 5.0 nm.

Then, a polysilicon film 318 having a thickness of 50.0 nm is formed on an upper surface of the silicon oxide film 317 by a CVD process.

Then, a silicon nitride film 319 having a thickness of 100.0 nm is formed on an upper surface of the polysilicon film 318 by an LPCVD process.

Then, an etching mask 320 is formed from a resist film on an upper surface of the silicon nitride film 319 at a bipolar transistor forming region (303) and a CMOS transistor forming region (304). Then, a portion (shown by a two-dot chain line) of the silicon nitride film 319 is removed by an RIE process using a mixed gas of trifluoromethane (CHF3) and oxygen (O2) as an etching gas. Then, the etching mask 320 is removed by an ashing process.

Figure 15D:
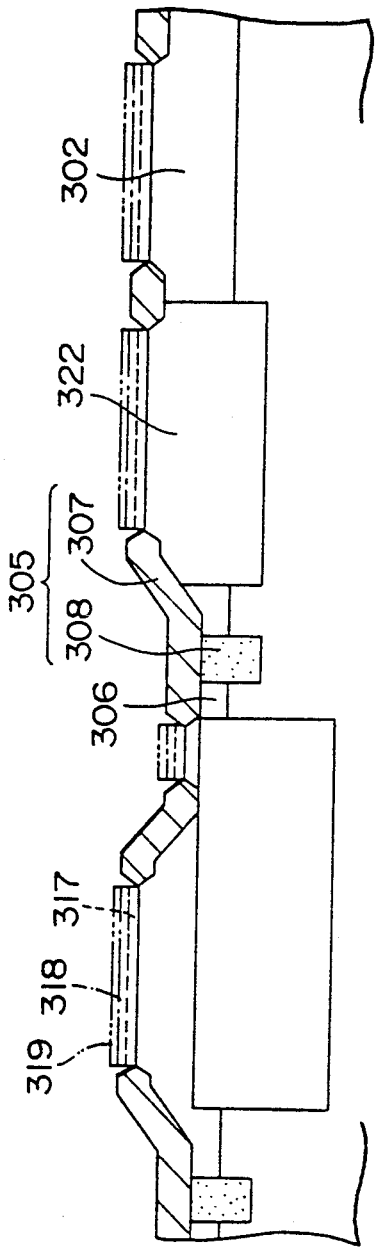

In the fourth step shown in FIG. 15D, a LOCOS oxide film 307 as a silicon oxide film having a thickness of about 400 nm is formed on the upper surface of the semiconductor layer 302 except on the silicon nitride film 319 by a LOCOS process. In the LOCOS process, the semiconductor substrate 301 is allowed to stand in a steam atmosphere at 950° C. for 120 minutes, so that the upper surface of the semiconductor layer 302 is oxidized to the depth of about 200 nm. Accordingly, it is regarded that the thin layer portion 306 at this time is formed substantially by digging the semiconductor layer 302 in the initial stage down to the depth of about 800 nm.

The above LOCOS process is similar to that to be used for the formation of an element isolating region for an ordinary CMOS transistor.

The LOCOS oxide film 307 formed by the above LOCOS process has a bird's beak length of about 0.1-0.2 $\mu$m. Accordingly, a MOS transistor having a gate length of about 0.5 $\mu$m can be formed.

Further, as the thin layer portion 306 is formed by taper etching the semiconductor layer 302, a stress to be concentrated at an angular portion of each stepped portion can be reduced when performing the LOCOS process. As a result, crystal defect is hard to generate in the semiconductor layer 302.

Then, the silicon nitride film 319 (shown by a two-dot chain line) is removed by a wet etching process using a phosphoric acid solution. Then, the polysilicon film 318 (shown by a one-dot chain line) is removed by a wet etching process using a potassium hydroxide solution. Then, the silicon oxide film 317 (shown by a dashed line) is removed by a wet etching process using a hydrofluoric acid solution.

Then, an ion implantation mask (not shown) for forming an element isolating diffusion layer (308) is formed from a resist film on the upper surfaces of the semiconductor layer 302 and the LOCOS oxide film 307.

Then, boron ions are implanted through the LOCOS oxide film 307 into the semiconductor layer 302 to form a p+ element isolating diffusion layer 308. At the same time, boron ions are implanted into the semiconductor layer 302 in the n-type MOS transistor forming region of the CMOS transistor to form a p-type well region 322.

The above ion implantation is carried out under the conditions of an acceleration energy of 150–200 keV and a dose of $1\times10^{13}-5\times10^{13}/cm^2$.

Thereafter, the ion implantation mask is removed by an ashing process.

Then, the p+ element isolating diffusion layer 308 and the p-type well region 322 are diffused by an annealing process at 900° C. for about 30 minutes.

In this manner, the element isolating region 305 for isolating the bipolar transistor forming region 303 from the CMOS transistor forming region 304 is formed.

Since the p+ element isolating diffusion layer 308 is formed by the ion implantation after the LOCOS process, undue diffusion of the p+ element isolating diffusion layer 308 and autodoping during the epitaxial growth can be prevented.

A manufacturing method for the Bi-CMOS device 300 employing the element isolating region 305 formed above will now be described with reference to FIGS. 15E to 15J.

In the first step shown in FIG. 15E, arsenic ions are implanted into a predetermined region of the semiconductor layer 302 by an ion implantation process to form an n+ collector drawn region 314 in the semiconductor layer 302 between the LOCOS oxide films 307 so that the n+ collector drawn region 314 is connected with the n+ collector buried region 313. However, the formation of the n+ collector drawn region 314 may precede the formation of the p-type well region 322.

Then, the semiconductor substrate 301 thus processed is allowed to stand in a steam oxidizing atmosphere at 850° C. for 15 minutes to form a gate oxide film 323 having a thickness of 15.0 nm on the exposed upper surface of the semiconductor layer 302.

Then, a first polysilicon film 324 having a thickness of about 50.0 nm is formed on the upper surfaces of the LOCOS oxide film 307 and the gate oxide film 323 by a CVD process.

Then, an etching mask 325 covering the gate oxide film 323 formed on the CMOS transistor forming region and the gate oxide film 323 formed on an emitter forming region of the bipolar transistor is formed from a resist film. Then, a portion (shown by a two-dot chain line) of the first polysilicon film 324 is removed by an RIE process using a mixed gas of trichlorotrifluoroethane ($C_2Cl_3F_3$) and sulfur hexafluoride ($SF_6$) as an etching gas. Then, a portion (shown by a one-dot chain line) of the gate oxide film 323 is removed by an RIE process using a mixed gas of trifluoromethane ($CHF_3$) and oxygen ($O_2$) as an etching gas. Thereafter, the etching mask 325 is removed by an ashing process.

In the second step shown in FIG. 15F, a second polysilicon film 326 having a thickness of 250 nm is formed on the entire upper surface of the semiconductor layer 302 so as to cover the first polysilicon film 324 by a CVD process.

Then, a first silicon oxide film 327 having a thickness of 300 nm is formed on an upper surface of the second polysilicon film 326 by a CVD process.

Figure 15G:
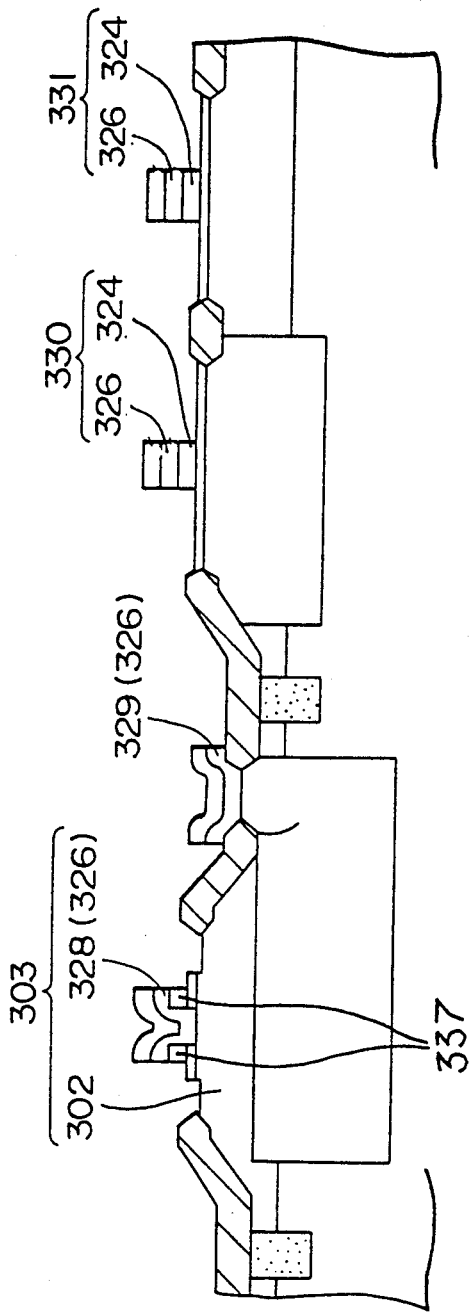

In the third step shown in FIG. 15G, a photolithography and RIE process is carried out to form an emitter electrode 328 and a collector electrode 329 of the bipolar transistor (309) from the second polysilicon film 326, a gate 330 of the n-type MOS transistor (310) of the CMOS transistor (312) from the first and second polysilicon films 324 and 326, and a gate 331 of the p-type MOS transistor (311) of the CMOS transistor (312) from the first and second polysilicon films 324 and 326.

The etching of the first silicon oxide film 327 uses a mixed gas of trifluoromethane ($CHF_3$) and oxygen ($O_2$) as an etching gas and the etching of the first and second polysilicon films 324 and 326 uses a mixed gas of trichlorotrifluoroethane ($C_2Cl_3F_3$) and sulfur hexafluoride ($SF_6$) as an etching gas.

In the above etching process, the upper portion of the semiconductor layer 302 in the bipolar transistor forming region 303 is etched because of a difference between the total thickness of the first and second polysilicon films 324 and 326 and the thickness of the second polysilicon film 326. However, as the etching depth of the semiconductor layer 302 is 50-100 nm, the characteristics of the bipolar transistor is not influenced by the above etching.

Figure 15H:
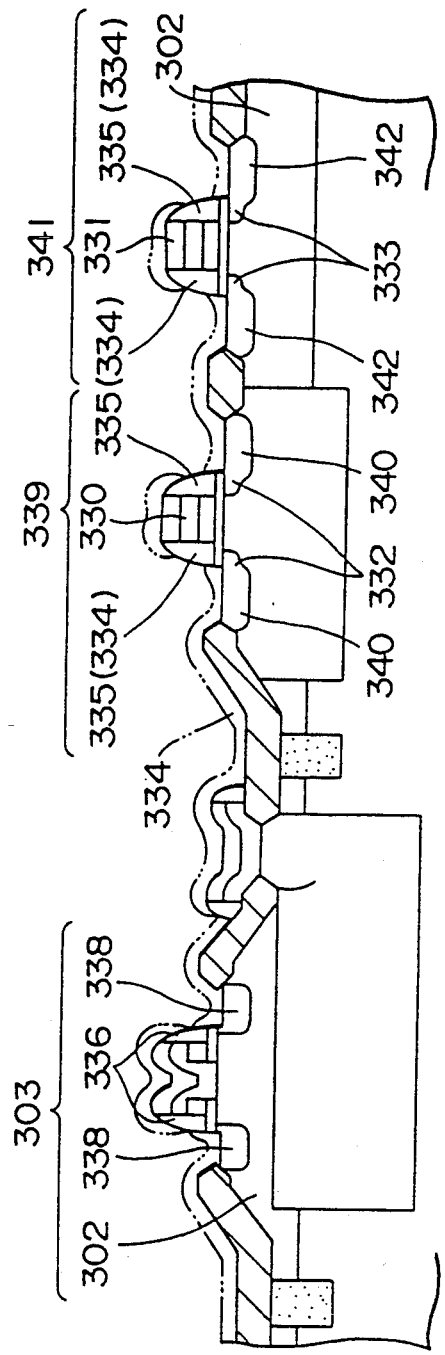

In the fourth step shown in FIG. 15H, phosphorus ions are implanted into the semiconductor layer 302 on the opposite sides of the gate 330 by an ion implantation process to form an LDD diffusion layer 332 of the n-type MOS transistor 310.

Then, boron ions are implanted into the semiconductor layer 302 on the opposite sides of the gate 331 by an ion implantation process to form an LDD diffusion layer 333 of the p-type MOS transistor 311.

Then, a second silicon oxide film 334 having a thickness of 200 nm is formed on the entire upper surface of the semiconductor layer 302 so as to cover the first silicon oxide film 327 by a CVD process. Then, a portion (shown by a two-dot chain line) of the second silicon oxide film 334 is removed by an etch-back process to form gate side wall insulating films 335 each having a width of 0.1-0.15 $\mu$m on the side walls of the gates 330 and 331, from the second silicon oxide film 334. At the same time, an emitter side wall insulating film 336 is also formed between the emitter and the base contact. At this time, a distance between the emitter and the base contact, that is, a total width of the emitter side wall insulating film 336 and the first polysilicon film 337 (324) formed on the emitter forming region becomes about 0.25 $\mu$m.

Thereafter, boron ions are implanted into a predetermined region of the semiconductor layer 302 by an ion implantation process to form a p+ graft base region 338 at the upper portion of the semiconductor layer 302 in the bipolar transistor forming region 303.

Then, arsenic ions are implanted into the upper portion of the semiconductor layer 302 in the n-type MOS transistor forming region 339 by an ion implantation process to form a source and drain region 340 of the n-type MOS transistor 310.

Then, boron ions are implanted into the upper portion of the semiconductor layer 302 in the p-type MOS transistor forming region 341 by an ion implantation process to form a source and drain region 342 of the p-type MOS transistor 311.

Figure 15I:
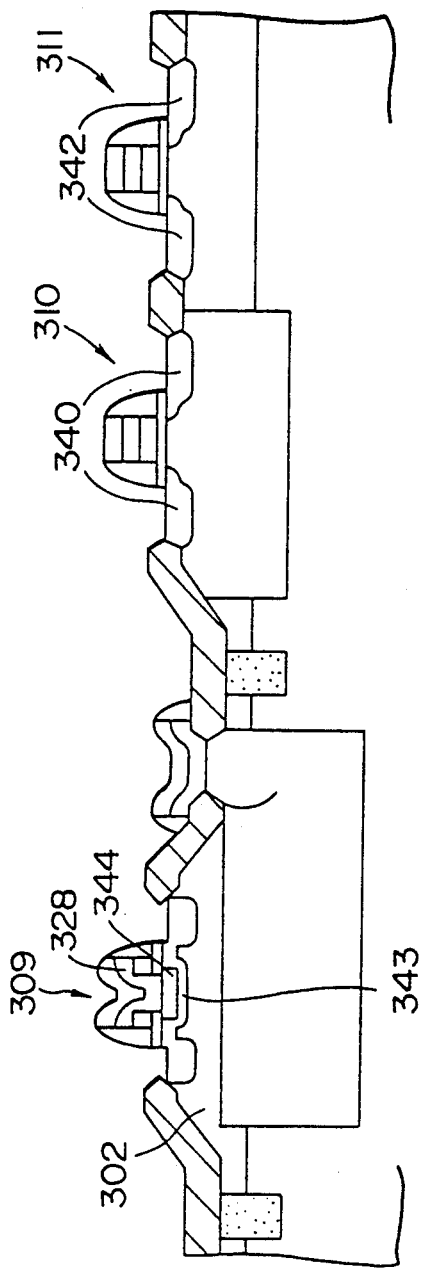

In the fifth step shown in FIG. 15I, boron ions are implanted into the emitter electrode 328 by an ion implantation process, and the boron ions in the emitter electrode 328 are then diffused into the upper portion of the semiconductor layer 302 by an impurity diffusion process to form a p-type base region 343. Then, arsenic ions are implanted into the emitter electrode 328 by an ion implantation process, and then the arsenic ions in the emitter electrode 328 are diffused into the upper portion of the semiconductor layer 302 by an impurity diffusion process to form an n+ emitter region 344.

In the above thermal diffusion process, the source and drain regions 340 and 342 are activated.

Thus, the NPN bipolar transistor 309, the n-type MOS transistor 310 and the p-type MOS transistor 311 are completed.

Figure 15J:
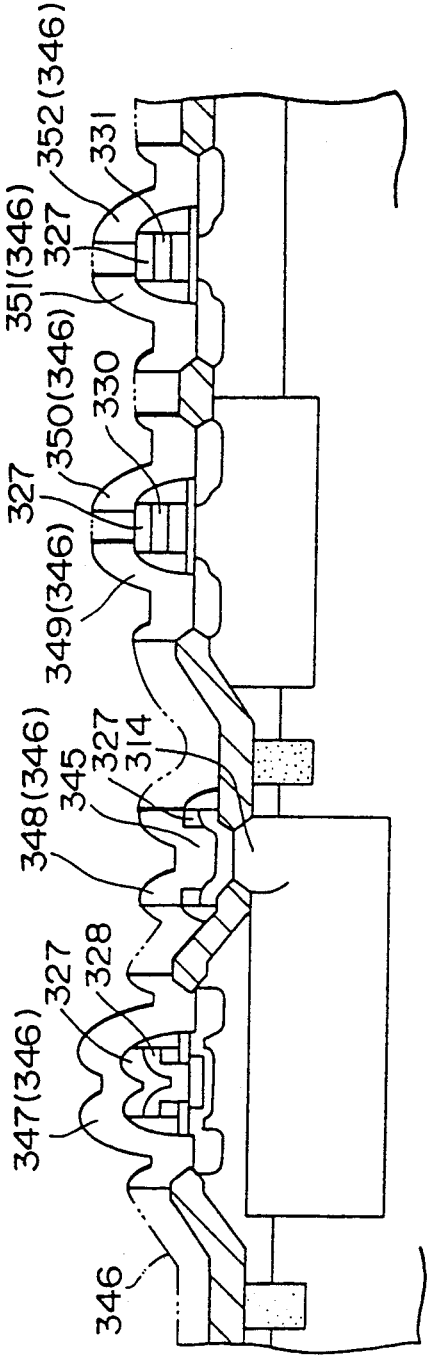

In the final step shown in FIG. 15J, a photolithography and etching process is carried out to form a contact hole (not shown) through the first silicon oxide film 327 formed on the emitter electrode 328, a contact hole 345 through the first silicon oxide film 327 formed on the n+ collector drawn region 314, and contact holes (not shown) through the first silicon oxide films 327 formed on the gates 330 and 331.

Then, a wiring film 346 having a laminated structure of a titanium film, titanium nitride film and aluminum/silicon alloy film (or a polysilicon film and a tungsten silicide film) is formed on the entire upper surface of the semiconductor layer 302 so as to fill all the above contact holes.

Then, a portion (shown by a two-dot chain line) of the wiring film 346 is removed by a photolithography and etching process to form electrode wirings 347, 348, 349, 350, 351 and 352. In FIG. 15J, an emitter electrode wiring and a gate electrode wiring are not shown.

Thus, the Bi-CMOS device 300 is completed.

A seventh preferred embodiment of the present invention will now be described with reference to FIG. 16 showing a structure of an element isolating region for isolating a bipolar transistor of a Bi-CMOS device from a bipolar transistor of another Bi-CMOS device as another device.

Referring to FIG. 16, reference numeral 361 designates a semiconductor substrate such as a p-type monocrystal silicon substrate. An n-type semiconductor layer 362 is formed on an upper surface of the semiconductor substrate 361. The semiconductor layer 362 is formed with a bipolar transistor forming region 363 in a Bi-CMOS device, a bipolar transistor forming region 413 in another Bi-CMOS device, and an element isolating region 414 isolating the first bipolar transistor forming region 363 from the second bipolar transistor forming region 413. A portion 415 of the semiconductor layer 362 where the element isolating region 414 is formed is thinner than the other portion of the semiconductor layer 362 where the first bipolar transistor forming region 363 and the second bipolar transistor forming region 413 are formed. This thin portion 415 of the semiconductor layer 362 has a thickness of about 0.4 $\mu$m, and the other portion of the semiconductor layer 362 has a thickness of about 1.0 $\mu$m. This thin portion 415 of the semiconductor layer 362 will be hereinafter referred to as a thin layer portion 415.

Thus, the element isolating region 414 isolating the first bipolar transistor forming region 363 from the second bipolar transistor forming region 413 is formed at the thin layer portion 415. This element isolating region 414 is constituted of a LOCOS oxide film 367 having a thickness of about 0.4 $\mu$m and a p+ element isolating diffusion layer 368 formed below a lower surface of the LOCOS oxide film 367 so as to reach the semiconductor substrate 361.

An NPN bipolar transistor 369 is formed in the first bipolar transistor forming region 363 of the semiconductor layer 362, and an NPN bipolar transistor 416 is formed in the second bipolar transistor forming region 413 of the semiconductor layer 362.

The semiconductor layer 362 is an n-type epitaxial growth layer formed by growing silicon from the semiconductor substrate 361. Alternatively, the semiconductor layer 362 may be an n-type well region formed by introducing an n-type impurity into an upper layer of the semiconductor substrate 361 by an ion implantation process.

An n+ collector buried region 417 of the NPN bipolar transistor 416 is formed in the semiconductor substrate 361 and the semiconductor layer 362 so as to extend to the thin layer portion 415. Further, an n+ collector drawn region 418 is formed in the thin layer portion 415 so as to be connected with the n+ collector buried region 417. Although not shown, an n+ collector buried region and an n+ collector drawn region of the NPN bipolar transistor 369 may be formed in the same manner.

A manufacturing method for the element isolating region 414 will now be described with reference to FIGS. 17A to 17D.

In the first step shown in FIG. 17A, an n+ collector buried regions 373 and 417 are formed in an upper layer of a semiconductor substrate 361 by a known method of forming a buried diffusion layer. The semiconductor substrate 361 is a monocrystal silicon substrate having a crystal orientation of <100>, for example. Then, a semiconductor layer 362 as an n-type epitaxial growth layer ($\rho$=1.0 $\Omega$.cm) having a thickness of 1.0 $\mu$m is formed on an upper surface of the semiconductor substrate 361 by an epitaxial growth process.

In the second step shown in FIG. 17B, an etching mask 375 is formed from a resist film by a photolithography process so as to cover the semiconductor layer 362 except a portion thereof where an element isolating region (not shown) for isolating a first bipolar transistor forming region 363 from a second bipolar transistor forming region 413. Then, a portion (shown by a two-dot chain line) of the semiconductor layer 362 is removed by a dry etching process to form a thin layer portion 415. The etching conditions of the dry etching process are the same as those mentioned in the sixth preferred embodiment, and the explanation thereof will be omitted. Further, as similar to the sixth preferred embodiment, tapering stepped portions 376 are formed on the opposite sides of the thin layer portion 415. Then, the etching mask 375 is removed by an ashing process.

In the third step shown in FIG. 17C, an upper surface of the semiconductor layer 362 is thermally oxidized in a dry oxygen atmosphere at 850° C. to form a silicon oxide film 377 having a thickness of 5.0 nm.

Then, a polysilicon film 378 having a thickness of 50.0 nm is formed on an upper surface of the silicon oxide film 377 by a CVD process.

Then, a silicon nitride film 379 having a thickness of 100.0 nm is formed on an upper surface of the polysilicon film 378 by an LPCVD process.

Then, a portion (shown by a two-dot chain line) of the silicon nitride film 379 is removed by a photolithography and RIE process. Then, an etching mask (not shown) is removed by an ashing process.

In the fourth step shown in FIG. 17D, a LOCOS oxide film 367 as a silicon oxide film having a thickness of about 400 nm is formed on the upper surface of the semiconductor layer 362 except on the silicon nitride film 379 by a LOCOS process. In the LOCOS process, the semiconductor substrate 361 is allowed to stand in a steam atmosphere at 950° C. for 120 minutes, so that the upper surface of the semiconductor layer 362 is oxidized to the depth of about 200 nm. Accordingly, it is regarded that the thin layer portion 415 at this time is formed substantially by digging the semiconductor layer 362 in the initial stage down to the depth of about 800 nm.

The above LOCOS process is similar to that to be used for the formation of an element isolating region for an ordinary CMOS transistor.

The LOCOS oxide film 367 formed by the above LOCOS process has a bird's beak length of about 0.1–0.2 $\mu$m.

Further, as the thin layer portion 415 is formed by taper etching the semiconductor layer 362, a stress to be concentrated at an angular portion of each stepped portion can be reduced when performing the LOCOS process. As a result, crystal defect is hard to generate in the semiconductor layer 362.

Then, as similar to the sixth preferred embodiment, the silicon nitride film 379 (shown by a two-dot chain line), the polysilicon film 378 (shown by a one-dot chain line) and the silicon oxide film 377 (shown by a dashed line) are sequentially removed.

Then, an ion implantation mask (not shown) for forming an element isolating diffusion layer (368) is formed from a resist film on the upper surfaces of the semiconductor layer 362 and the LOCOS oxide film 367.

Then, as similar to the sixth preferred embodiment, boron ions are implanted through the LOCOS oxide film 367 into the semiconductor layer 362 to form a p+ element isolating diffusion layer 368. Thereafter, the ion implantation mask is removed by an ashing process.

Then, the p+ element isolating diffusion layer 368 is diffused by an annealing process at 900° C. for about 30 minutes.

In this manner, the element isolating region 414 for isolating the first bipolar transistor forming region 363 from the second bipolar transistor forming region 413 is formed.

Since the p+ element isolating diffusion layer 368 is formed by the ion implantation after the LOCOS process, undue diffusion of the p+ element isolating diffusion layer 368 and autodoping during the epitaxial growth can be prevented.

It is understood that the manufacturing method for the element isolating region 305 in the sixth preferred embodiment is substantially the same as the manufacturing method for the element isolating region 414 in the seventh preferred embodiment. Accordingly, an element isolating region for isolating a bipolar transistor forming region from a CMOS transistor forming region and another element isolating region for isolating the bipolar transistor forming region from another bipolar transistor forming region near the bipolar transistor forming region can be simultaneously formed.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. A manufacturing method for a bipolar transistor, comprising:

the first step of forming a collector buried region at an upper portion of a semiconductor substrate, forming a semiconductor layer on an upper surface of said semiconductor substrate, forming an element isolating region in said semiconductor layer, forming a first insulating film at an upper portion of said semiconductor layer, and forming a first polysilicon film on an entire upper surface of said semiconductor layer so as to cover said first insulating film;

the second step of forming a mask pattern from said first polysilicon film on a base forming region around an emitter forming region, and etching said first polysilicon film with said mask pattern used as an etching mask to form an offset insulating film from said first insulating film;

the third step of forming a second polysilicon film on the entire upper surface of said semiconductor layer so as to cover said mask pattern, forming a second insulating film on an entire upper surface of said second polysilicon film, and etching said second insulating film and said second polysilicon film to form an emitter electrode from said second polysilicon film;

the fourth step of forming an emitter side wall insulating film on a side wall of said emitter electrode to form an emitter insulating film constituted of said emitter side wall insulating film and said second Insulating film formed on an upper surface of said emitter electrode;

the fifth step of forming a graft base region at an upper portion of said semiconductor layer on both sides of said base forming region, and forming a collector drawn region in said semiconductor layer so that said collector drawn region connects with said collector buried region and is arranged on the side of said base forming region adjacent to said element isolating region; and the sixth step of forming a base region in said base forming region, forming an emitter region in said emitter forming region, and forming a base electrode connecting with said graft base region and contacting with said emitter insulating film and a collector electrode connecting with said collector drawn region.

2. A manufacturing method for a bipolar transistor, comprising:

the first step of forming a collector buried region at an upper portion of a semiconductor substrate, forming a semiconductor layer on an upper surface of said semiconductor substrate, forming a first insulating film at an upper portion of said semiconductor layer, and forming a first polysilicon film on an entire upper surface of said semiconductor layer so as to cover said first insulating film;

the second step of forming a mask pattern from said first polysilicon film on a base forming region around an emitter forming region, and etching said first polysilicon film with said mask pattern used as an etching mask to form an offset insulating film from said first insulating film;

the third step of forming a second polysilicon film on the entire upper surface of said semiconductor layer so as to cover said mask pattern, forming a second insulating film on an entire upper surface of said second polysilicon film, and etching said second insulating film and said second polysilicon film to form an emitter electrode from said second polysilicon film;

the fourth step of forming an emitter side wall insulating film on a side wall of said emitter electrode to form an emitter insulating film constituted of said emitter side wall insulating film and said second insulating film formed on an upper surface of said emitter electrode;

the fifth step of forming a graft base region at an upper portion of said semiconductor layer on one side of said base forming region, and forming a collector drawn region in said semiconductor layer so that said collector drawn region connects with said collector buried region and is arranged on the other side of said base forming region adjacent to a portion of said semiconductor layer connecting with said base forming region; and the sixth step of forming a base region in said base forming region, forming an emitter region in said emitter forming region, and forming a base electrode connecting with said graft base region and contacting with one side of said emitter insulating film and a collector electrode connecting with said collector drawn region and contacting with the other side of said emitter insulating film.

* * * * *